United States Patent
Ono

(10) Patent No.: US 11,835,597 B2
(45) Date of Patent: Dec. 5, 2023

(54) MAGNETIC DETECTION SYSTEM, MAGNETIC SIGNAL WAVEFORM PATTERN CLASSIFICATION METHOD, AND WAVEFORM PATTERN DISTRIBUTION GENERATION METHOD FOR MAGNETIC DETECTION SYSTEM

(71) Applicant: Shimadzu Corporation, Kyoto (JP)

(72) Inventor: Takeshi Ono, Kyoto (JP)

(73) Assignee: Shimadzu Corporation, Kyoto (JP)

( * ) Notice: Subject to any disclaimer, the term of this patent is extended or adjusted under 35 U.S.C. 154(b) by 53 days.

(21) Appl. No.: 17/642,861

(22) PCT Filed: Aug. 27, 2020

(86) PCT No.: PCT/JP2020/032433
§ 371 (c)(1),
(2) Date: Mar. 14, 2022

(87) PCT Pub. No.: WO2021/131158
PCT Pub. Date: Jul. 1, 2021

(65) Prior Publication Data
US 2022/0390528 A1    Dec. 8, 2022

(30) Foreign Application Priority Data

Dec. 25, 2019  (JP) ................. 2019-234165

(51) Int. Cl.
*G01R 33/02*  (2006.01)
*G01R 33/00*  (2006.01)
*G01R 33/09*  (2006.01)

(52) U.S. Cl.
CPC ..... *G01R 33/0206* (2013.01); *G01R 33/0005* (2013.01); *G01R 33/091* (2013.01)

(58) Field of Classification Search
CPC .. B64G 1/366; G01R 33/0206; G01R 33/028; G01R 33/038; G01R 33/1215
See application file for complete search history.

(56) References Cited

U.S. PATENT DOCUMENTS

| 2005/0047026 | A1* | 3/2005 | Yuasa | G11B 5/3919 |
| | | | | 257/E43.004 |
| 2017/0363695 | A1* | 12/2017 | Ueno | G01R 33/243 |

FOREIGN PATENT DOCUMENTS

| JP | 2013-156225 A | 8/2013 |
| JP | 2014-235059 A | 12/2014 |
| JP | 2015-025692 A | 2/2015 |
| JP | 2015-215179 A | 12/2015 |

OTHER PUBLICATIONS

Written Opinion by the International Search Authority for PCT application PCT/JP2020/032433, dated Nov. 17, 2020, submitted with a machine translation.

* cited by examiner

*Primary Examiner* — Tung X Nguyen
(74) *Attorney, Agent, or Firm* — Muir Patent Law, PLLC

(57) ABSTRACT

The magnetic detection system (100) is provided with a magnetic sensor (1) and a waveform pattern classification unit (33c). The waveform pattern classification unit (33c) is configured to classify waveform patterns of magnetic signals acquired by the magnetic sensor (1) based on a waveform pattern distribution (60) generated based on a plurality of fully connected layers (52c) generated by weighting and connecting respective features in waveform patterns for each waveform pattern by machine-learning, and features in the waveform patterns of the magnetic signals.

10 Claims, 20 Drawing Sheets

MAGNETIC DETECTION SYSTEM, MAGNETIC SIGNAL WAVEFORM PATTERN CLASSIFICATION METHOD, AND WAVEFORM PATTERN DISTRIBUTION GENERATION METHOD FOR MAGNETIC DETECTION SYSTEM

TECHNICAL FIELD

The present invention relates to a magnetic detection system, a magnetic signal waveform pattern classification method, and a waveform pattern distribution generation method for a magnetic detection system.

BACKGROUND OF THE INVENTION

Conventionally, a magnetic detection system for detecting a magnetic body by a magnetic sensor is known. Such a magnetic detection system is disclosed in Japanese Unexamined Patent Application Publication No. 2013-156225.

Japanese Unexamined Patent Application Publication No. 2013-156225 discloses a magnetic detection system provided with a magnetic sensor and a determination unit for determining whether or not a magnetic signal acquired by the magnetic sensor is a signal derived from the magnetic body. In the magnetic detection system described in Japanese Unexamined Patent Application Publication No. 2013-156225, it is configured to determine whether the magnetic signal acquired by the magnetic sensor is a magnetic signal derived from the magnetic body or a magnetic signal derived from noise based on the waveform pattern of the magnetic signal acquired by the magnetic sensor and a plurality of standard waveform patterns to detect the magnetic body.

PRIOR ART DOCUMENT

Patent Document

Patent Document 1: Japanese Unexamined Patent Application Publication No. 2013-156225

SUMMARY OF THE INVENTION

Problems to be Solved by the Invention

Information about a traveling direction of a magnetic body, such as the information about to which direction the detected magnetic body is moving with respect to the magnetic sensor (whether the magnetic body is approaching or moving away from the magnetic sensor) is important for a user monitoring the approaching or the passing of the magnetic body. In the magnetic detection system described in Japanese Unexamined Patent Application Publication No. 2013-156225, it is possible to detect the magnetic body by determining whether or not the magnetic signal acquired from the magnetic sensor is a signal derived from the magnetic body or a magnetic signal derived from noise, based on the waveform pattern of the magnetic signal acquired by the magnetic sensor and a plurality of standard waveform patterns. However, the traveling direction of the magnetic body cannot be determined from the magnetic signal acquired by the magnetic sensor. Therefore, it has been desired that the traveling direction of the magnetic body can be determined from the magnetic signal acquired by the magnetic sensor.

The present invention has been made to solve the aforementioned problems. One object of the present invention is to provide a magnetic detection system capable of determining a traveling direction of a magnetic body from a magnetic signal acquired by a magnetic sensor, a magnetic signal waveform pattern distribution classification method, and a waveform pattern distribution generation method for a magnetic detection system.

Means for Solving the Problem

A magnetic detection system according to a first aspect of the present invention includes:
  a magnetic sensor arranged in water to acquire magnetic signals; and
  a waveform pattern classification unit,
  wherein the waveform pattern classification unit is configured to classify waveform patterns of a plurality of magnetic signals acquired by the magnetic sensor, based on a waveform pattern distribution and features in the waveform patterns of the plurality of magnetic signals acquired by the magnetic sensor, the waveform pattern distribution being generated based on a plurality of fully connected layers generated by weighting and connecting respective features in the waveform patterns of the plurality of magnetic signals for each waveform pattern by machine-learning the waveform patterns of the plurality of magnetic signals as input data, the waveform patterns of the plurality of magnetic signals each corresponding to a relative position and a traveling direction of a magnetic body with respect to the magnetic sensor.

A magnetic signal waveform pattern classification method according to a second aspect of the present invention includes the steps of:
  acquiring magnetic signals by a magnetic sensor arranged in water;
  inputting the magnetic signals acquired by the magnetic sensor to a trained model in which waveform patterns of a plurality of magnetic signals each corresponding to a relative position and a traveling direction of a magnetic body with respect to the magnetic sensor are machine-learned as input data;
  generating sensor signal fully connected layers in which features in the waveform patterns of the magnetic signals acquired by the magnetic sensor and inputted to the trained model are weighted and connected; and
  classifying the waveform patterns of the magnetic signals acquired by the magnetic sensor, based on a waveform pattern distribution and the sensor signal fully connected layers generated using the trained model, the waveform pattern distribution being a distribution of waveform patterns of the plurality of magnetic signals generated based on a plurality of fully connected layers generated by weighting and connecting respective features in the waveform patterns of a plurality of magnetic signals each corresponding to a relative position and a traveling direction of a magnetic body with respect to the magnetic sensor as input data by machine-learning.

A waveform pattern distribution generation method for a magnetic detection system according to a third aspect of the present invention includes the steps of:
  machine-learning waveform patterns of a plurality of magnetic signals each corresponding to a relative position and a traveling direction of a magnetic body with respect to a magnetic sensor as input data;
  generating a plurality of fully connected layers in which respective features in the waveform patterns of the plurality of magnetic signals are weighted and connected for each waveform pattern, using a trained model in which the waveform patterns of the plurality of magnetic signals each corresponding to the relative position and the traveling direction of the magnetic body with respect to the magnetic sensor are machine-learned as input data; and generating a waveform pattern distribution that is a distribution of the waveform patterns of the plurality of magnetic signals used to classify the waveform patterns of the magnetic signals acquired by the magnetic sensor, based on the plurality of fully connected layers.

Effects of the Invention

Here, the inventor of the present application has focused on the fact that there is a correlation between a waveform pattern of a magnetic signal acquired by a magnetic sensor and a relative position and a traveling direction of a magnetic body with respect to the magnetic sensor. As a result of intensive studies by the inventor of the present application, the inventor of the present application has found the fact that in a waveform pattern distribution generated based on a plurality of fully connected layers in which respective features in waveform patterns of a plurality of signals are weighted and connected for each of the waveform patterns of the plurality of signals by machine-learning, the waveform pattern distribution is classified depending on the waveform pattern having a correlation with the relative position and the traveling direction of the magnetic body with respect to the magnetic sensor, and has conceived the present invention.

In the magnetic detection system according to the first aspect of the present invention, as described above, a waveform pattern distribution is generated, based on a plurality of fully connected layers generated by weighting the respective features in the waveform patterns of the plurality of signals for each of the waveform patterns of the plurality of signals each corresponding to the relative position and the traveling direction of the magnetic body with respect to the magnetic sensor. Then, the waveform pattern classification unit is configured to classify the waveform pattern of the magnetic signal acquired by the magnetic sensor, based on the waveform pattern and the features in the waveform pattern of the magnetic signal acquired by the magnetic sensor. With this, it is possible to classify the waveform pattern of the magnetic signal acquired by the magnetic sensor from the feature in the waveform pattern of the magnetic signal acquired by the magnetic sensor, by using the waveform pattern distribution generated based on the plurality of fully connected layers generated by weighting the respective features in the waveform patterns of the plurality of signals for each of the waveform patterns of the plurality of signals. Since there is a correlation between the waveform pattern of the magnetic signal and the relative position and the traveling direction of the magnetic body with respect to the magnetic sensor, it is possible to determine the relative position and the traveling direction of the magnetic body with respect to the magnetic sensor, based on the classification result of the waveform pattern of the magnetic signal. Consequently, it is possible to provide a magnetic detection system capable of determining the traveling direction of the magnetic body from the magnetic signal acquired by the magnetic sensor.

In the magnetic signal waveform pattern classification method according to the second aspect of the present invention, as described above, the sensor signal fully connected layer in which the features in the waveform pattern of the magnetic signal acquired by the magnetic sensor are weighted and connected is generated using a trained model. Then, a waveform pattern distribution that is a distribution of waveform patterns of a plurality of signals is generated based on a plurality of fully connected layers in which the respective features in waveform patterns of the plurality of signals are weighted and connected for each of waveform patterns of the plurality of signals, and the waveform pattern of the magnetic signal acquired by the magnetic sensor is classified based on the sensor signal fully connected layer and the waveform pattern distribution. With this, by using the waveform pattern distribution generated based on the plurality of fully connected layers generated by weighting the respective features in the waveform patterns of the plurality of signals for each waveform pattern, the waveform pattern of the magnetic signal acquired by the magnetic sensor can be classified from sensor signal fully connected layers in which the features in the waveform pattern of the magnetic signal acquired by the magnetic sensor are weighted and connected. Since there is a correlation between the waveform pattern of the magnetic signal and the relative position and the traveling direction of the magnetic body with respect to the magnetic sensor, it is possible to determine the relative position and the traveling direction of the magnetic body with respect to the magnetic sensor, based on the classification result of the waveform pattern of the magnetic signal. Consequently, it is possible to provide a magnetic signal waveform pattern classification method capable of determining the traveling direction of the magnetic body from the magnetic signal acquired by the magnetic sensor.

In the waveform pattern distribution generation method for a magnetic detection system according to the third aspect of the present invention, as described above, the waveform pattern distribution that is the distribution of waveform patterns of the plurality of signals is generated, based on the plurality of fully connected layers in which the respective features in the waveform patterns of the plurality of signals each corresponding to the relative position and the traveling direction of the magnetic body with respect to the magnetic sensor are weighted and connected for each waveform pattern of the plurality of signals. With this, by using the generated waveform pattern distribution in the magnetic detection system, it is possible to classify the waveform pattern of the magnetic signal acquired by the magnetic sensor from the feature in the waveform pattern of the magnetic signal acquired by the magnetic sensor. Since there is a correlation between the waveform pattern of the magnetic signal and the relative position and the traveling direction of the magnetic body with respect to the magnetic sensor, it is possible to determine the relative position and the traveling direction of the magnetic body with respect to the magnetic sensor, based on the classification result of the waveform pattern of the magnetic signal. Consequently, it is possible to provide a waveform pattern distribution generation method for a magnetic detection system capable of determining the traveling direction of the magnetic body from the magnetic signal acquired by the magnetic sensor.

EMBODIMENTS FOR CARRYING OUT THE INVENTION

Hereinafter, some embodiments in which the present invention is embodied will be described with reference to the attached drawings.

(General Configuration of Magnetic Detection System)

Figure 1:
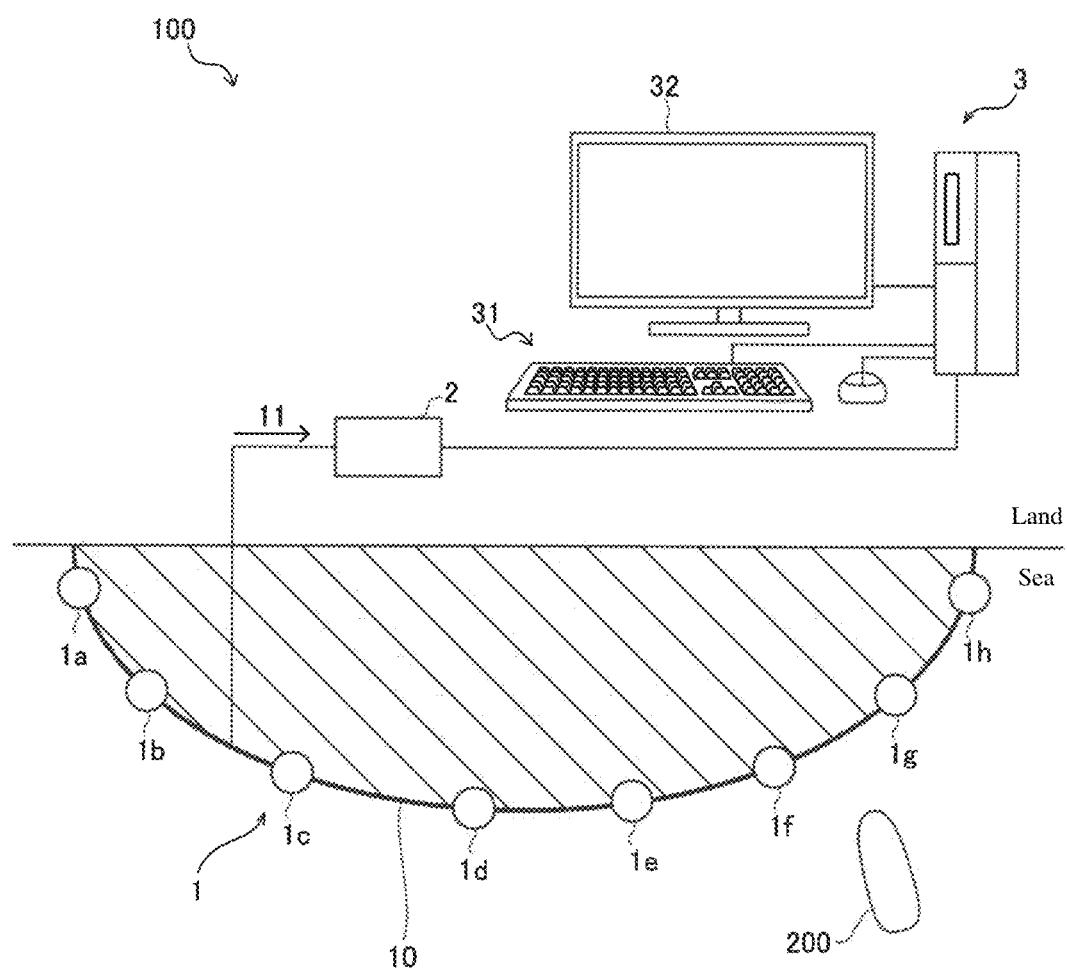
FIG. 1 is a schematic diagram showing an entire configuration of a magnetic detection system according to one embodiment of the present invention.
Figure 2:
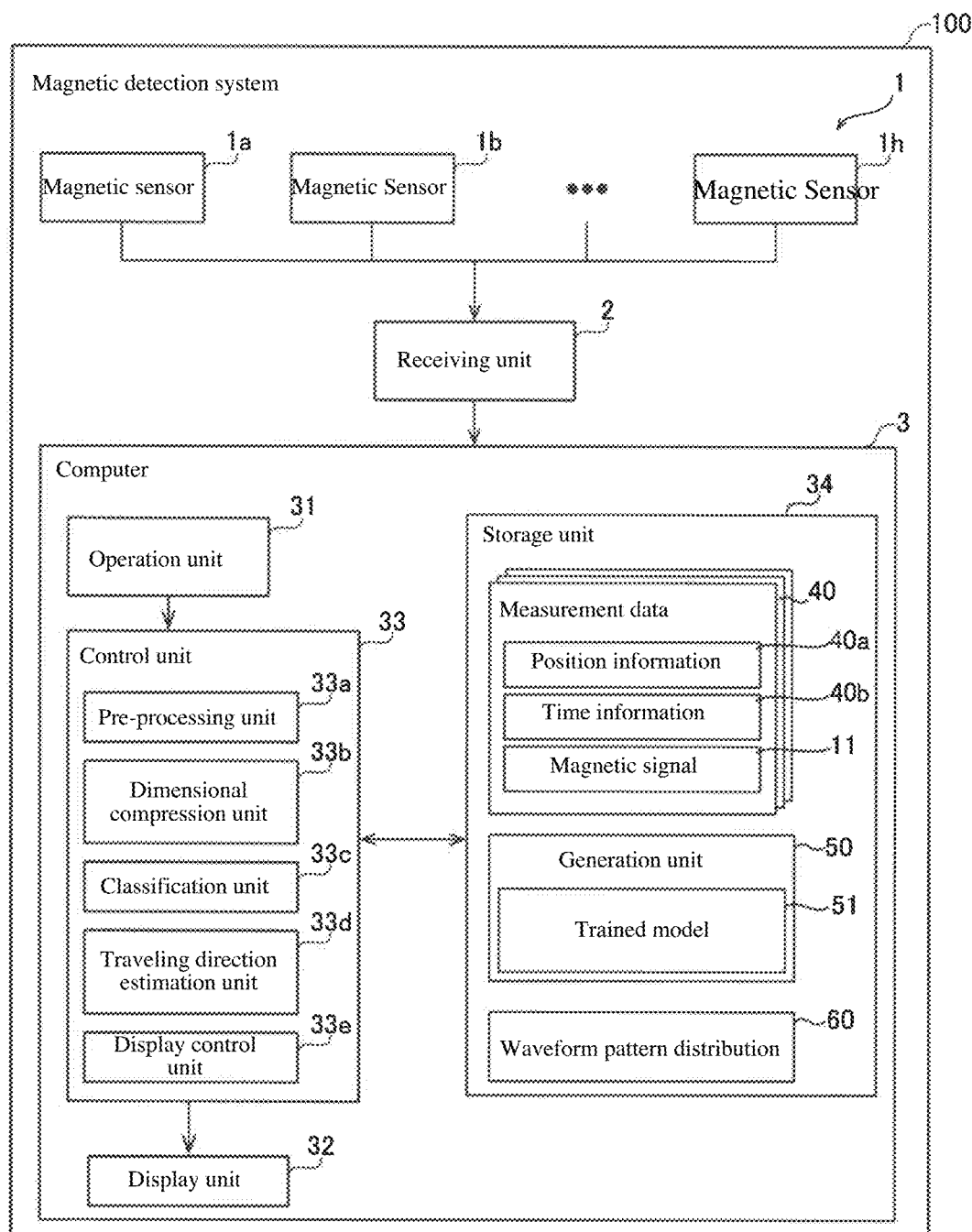
FIG. 2 is a block diagram showing an entire configuration of a magnetic detection system according to one embodiment of the present invention.

Referring to FIGS. 1 and 2, an entire configuration of a magnetic detection system 100 according to one embodiment of the present invention will be described.

The magnetic detection system 100 according to this embodiment is provided with, as shown in FIG. 1, a plurality of magnetic sensors 1 arranged in a detection region 10, a receiving unit 2, and a computer 3. The magnetic detection system 100 of this embodiment is a system for detecting approach of a magnetic body 200 by detecting the magnetic signal 11 derived from the magnetic body 200. Further, in this embodiment, the magnetic detection system 100 is configured to estimate the traveling direction of the magnetic body 200 with respect to the plurality of magnetic sensors 1 by classifying the waveform patterns of the magnetic signals 11 acquired by the plurality of magnetic sensors 1.

The user monitoring the approach (intrusion) of the magnetic body 200 to the detection region 10 can determine whether or not the magnetic body 200 has passed (by visually recognizing a display unit 32) based on the determination result 81 (see FIG. 3) and the estimation result 84 (see FIG. 17) outputted by the magnetic detection system 100, which will be described later, and can estimate the traveling direction of the magnetic body 200. The plurality of magnetic sensors 1 is arranged, for example, in a port or the like. The magnetic body 200 includes a vessel, a diver, etc.

As shown in FIG. 1, the plurality of magnetic sensors 1 is provided in water (in the sea) and is configured to acquire magnetic signals 11. In this embodiment, the plurality of magnetic sensors 1 is installed in the detection region 10 for detecting whether or not the magnetic body 200 has approached. The plurality of magnetic sensors 1 includes a first magnetic sensor 1a, a second magnetic sensor 1b, a third magnetic sensor 1c, a fourth magnetic sensor 1d, a fifth magnetic sensor 1e, a sixth magnetic sensor 1f, a seventh magnetic sensor 1g, and an eighth magnetic sensor 1h. The plurality of magnetic sensors 1 is installed so as to be spaced apart from each other and is wired to the receiving unit 2. The plurality of magnetic sensors 1 acquires the magnetic signals 11 derived from the approach of the magnetic body 200 to the detection region 10.

Further, the plurality of magnetic sensors 1 is configured, for example, to output the acquired magnetic signals 11 to the receiving unit 2 installed on the land as optical signals. The plurality of magnetic sensors 1 is each configured to output a magnetic signal 11 acquired at a predetermined sampling period. The plurality of magnetic sensors 1 each includes, for example, a fluxgate sensor. Further, the plurality of magnetic sensors 1 each may be a sensor for acquiring the magnetic signal 11 by only one axis, or a sensor for acquiring the magnetic signal in a plurality of axial directions, such as, e.g., three axes (X-axis, Y-axis, and Z-axis). Further, in this embodiment, the predetermined sampling period is set as 0.5 seconds. Note that the predetermined sampling period may be arbitrarily changed.

The receiving unit 2 is wired to the plurality of magnetic sensors 1 to receive the magnetic signals 11 acquired by the plurality of magnetic sensors 1. The receiving unit 2 converts each magnetic signal 11, which is a received optical signal, into an electric signal. The receiving unit 2 is wired to a computer 3 to transmit the magnetic signal 11 converted into an electric signal to the computer 3. Note that the connection between the plurality of magnetic sensors 1 and the receiving unit 2, and the connection between the receiving unit 2 and the computer 3 may be connected wirelessly.

As shown in FIG. 2, the computer 3 includes an operation unit 31, a display unit 32, a control unit 33, and a storage unit 34. The computer 3 is, for example, a computer terminal used by a user in a land monitoring facility.

The operation unit 31 receives an input operation by the user. The operation unit 31 includes a pointing device, such as, e.g., a keyboard and a mouse.

The display unit 32 is configured to display, under the control of the control unit 33, the magnetic signals 11 acquired by the plurality of magnetic sensors 1, the determination result 81 (see FIG. 3) outputted by the trained model 51 that will be described later, and the estimation result 84 (see FIG. 17) that is the estimation result of the traveling direction of the magnetic body 200 outputted by a traveling direction estimation unit 33d, which will be described later. The displays of the magnetic signal 11, the determination result 81, and the estimation result 84 by the display unit 32 will be described later. The display unit 32 includes, for example, a liquid crystal display.

The storage unit 34 stores the magnetic signals 11 under the control of the control unit 33. Further, the storage unit 34 acquires measurement data 40 including the magnetic signals 11 acquired by the magnetic sensors 1. The measurement data 40 includes, in addition to the magnetic signals 11, the position information 40a of the magnetic sensor 1 in the detection region 10 and the time information 40b about the acquisition time of the magnetic signal 11. The storage unit 34 stores a generation unit 50 storing a trained model 51, which will be described later, a waveform pattern distribution 60, and various programs to be executed by the control unit 33. The generation unit 50 may include a plurality of trained models, or may include the trained model 51 together with a trained model that has been trained differently from the trained model 51. The storage unit 34 includes, for example, an HDD (Hard Disk Drive), a non-volatile memory, and the like.

In this embodiment, as will be described later, the generation unit 50 generates a fully connected layers 51c (see FIG. 3), based on the input layers 51a (see FIG. 3) that are acquired by the plurality of magnetic sensors 1 and are input data of the magnetic signals 11 inputted to the trained model 51 of the generation unit 50.

Further, as will be described later, the generation unit 50 is configured to generate output layers 51d (see FIG. 3) for outputting a determination result 81 (see FIG. 3) indicating whether or not each of the magnetic signals 11 acquired by the plurality of magnetic sensors 1 is derived from the magnetic body 200, based on the generated fully connected layers 51c, for each magnetic sensor 1. The output layer 51d is generated based on the input layer 51a, which is input data of the magnetic signal 11 inputted to the trained model 51 of the generation unit 50.

The trained model 51 is a trained neural network model stored (memorized) in the storage unit 34. The trained model 51 will be described later in detail.

Figure 12:
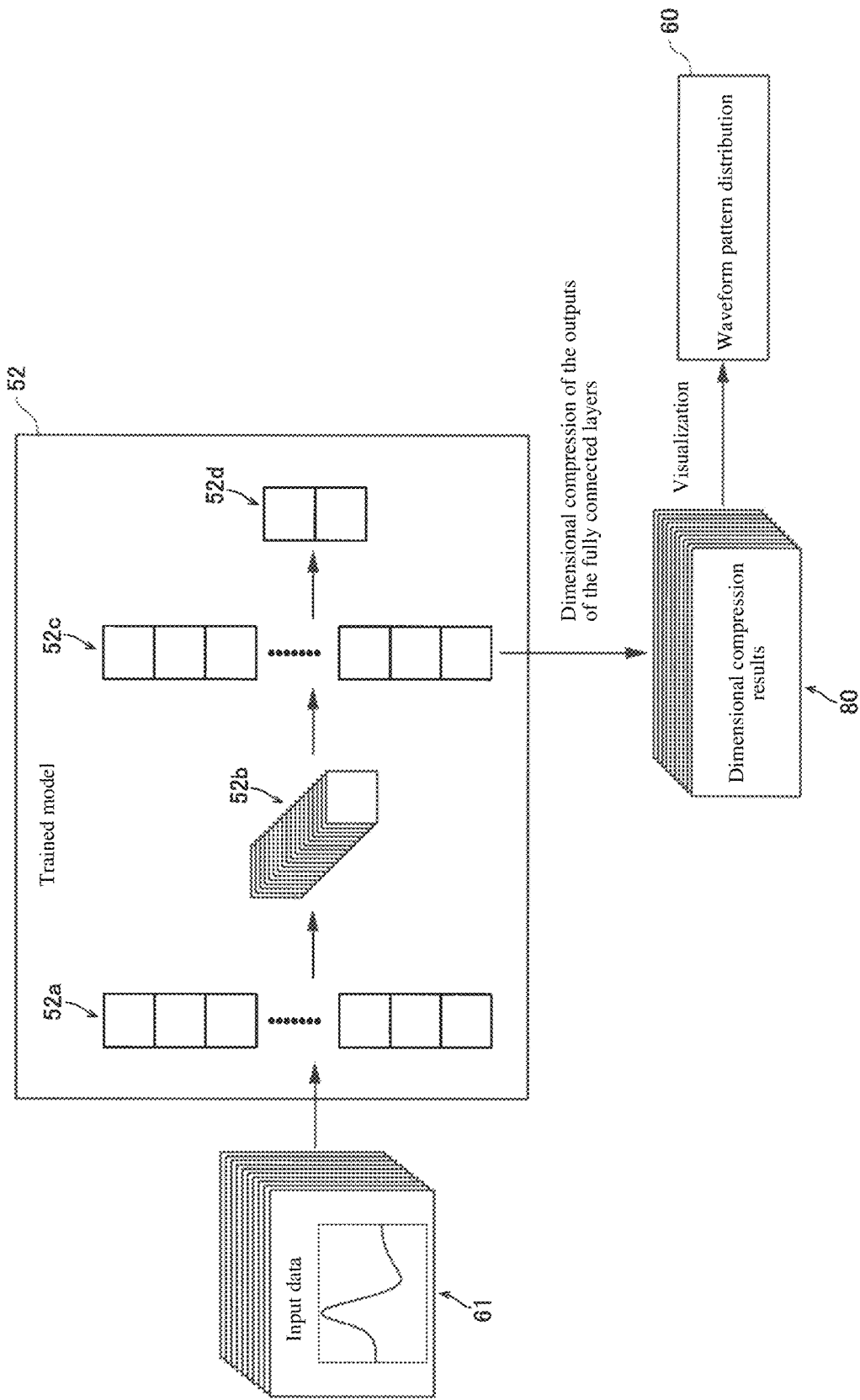
FIG. 12 is a diagram showing an example of a waveform pattern distribution generation according to one embodiment of the present invention.

As will be described later, the waveform pattern distribution 60 is generated based on a plurality of fully connected layers 52c (see FIG. 12) generated by weighting and connecting the respective features in the waveform patterns by performing machine-learning of the waveform patterns of the plurality of signals each corresponding to the relative position and the traveling direction of the magnetic body 200 with respect to the plurality of magnetic sensors 1 as input data 61 (see FIG. 12)

The control unit 33 includes, as functional configurations, a pre-processing unit 33a, a classification unit 33c, a dimensional compression unit 33b, a traveling direction estimation unit 33d, and a display control unit 33e. That is, by executing a program, the control unit 33 functions as the pre-processing unit 33a, the dimensional compression unit 33b, the classification unit 33c, the traveling direction estimation unit 33d, and the display control unit 33e. The control unit 33 includes, for example, a CPU (Central Processing Unit), and a GPU (Graphics Processing Unit).

The pre-processing unit 33a is configured to perform pre-processing of the magnetic signal 11. That is, the pre-processing unit 33a removes high-frequency noise components from the acquired magnetic signal 11. The pre-processing unit 33a includes, for example, a low-pass filter.

The dimensional compression unit 33b is configured to perform, as described later, dimensional compression with respect to the outputs from the fully connected layers 51c generated by the trained model 51 (see FIG. 3). The dimensional compression unit 33b dimensionally compresses the outputs of the fully connected layers 51c by means of a dimensionally compressing algorithm. The dimensional compression algorithm includes any one of the t-SNE (Stochastic Neighbor Embedding), the PCA (Principal Component Analysis), etc. Note that in this embodiment, an example will be described in which the t-SNE is used as the dimensional compression algorithm of the dimensional compression unit 33b.

The classification unit 33c is configured to classify the waveform patterns acquired by the plurality of magnetic sensors 1, based on the waveform pattern distribution 60, and the features in the waveform patterns of the magnetic signals 11 acquired by the plurality of magnetic sensors 1. Note that the classification unit 33c is an example of the "waveform pattern classification unit" recited in claims.

The traveling direction estimation unit 33d is configured to estimate the traveling direction of the magnetic body 200 with respect to the plurality of magnetic sensors 1, based on the classification by the classification unit 33c with respect to the waveform patterns of the magnetic signals 11 acquired by the plurality of magnetic sensors 1.

The display control unit 33e is configured to control the display of the display unit 32. The display control unit 33e controls the display of the display unit 32, based on the magnetic signals 11, the determination result 81, and the estimation result 84.

(Configuration of Trained Model)

Figure 3:
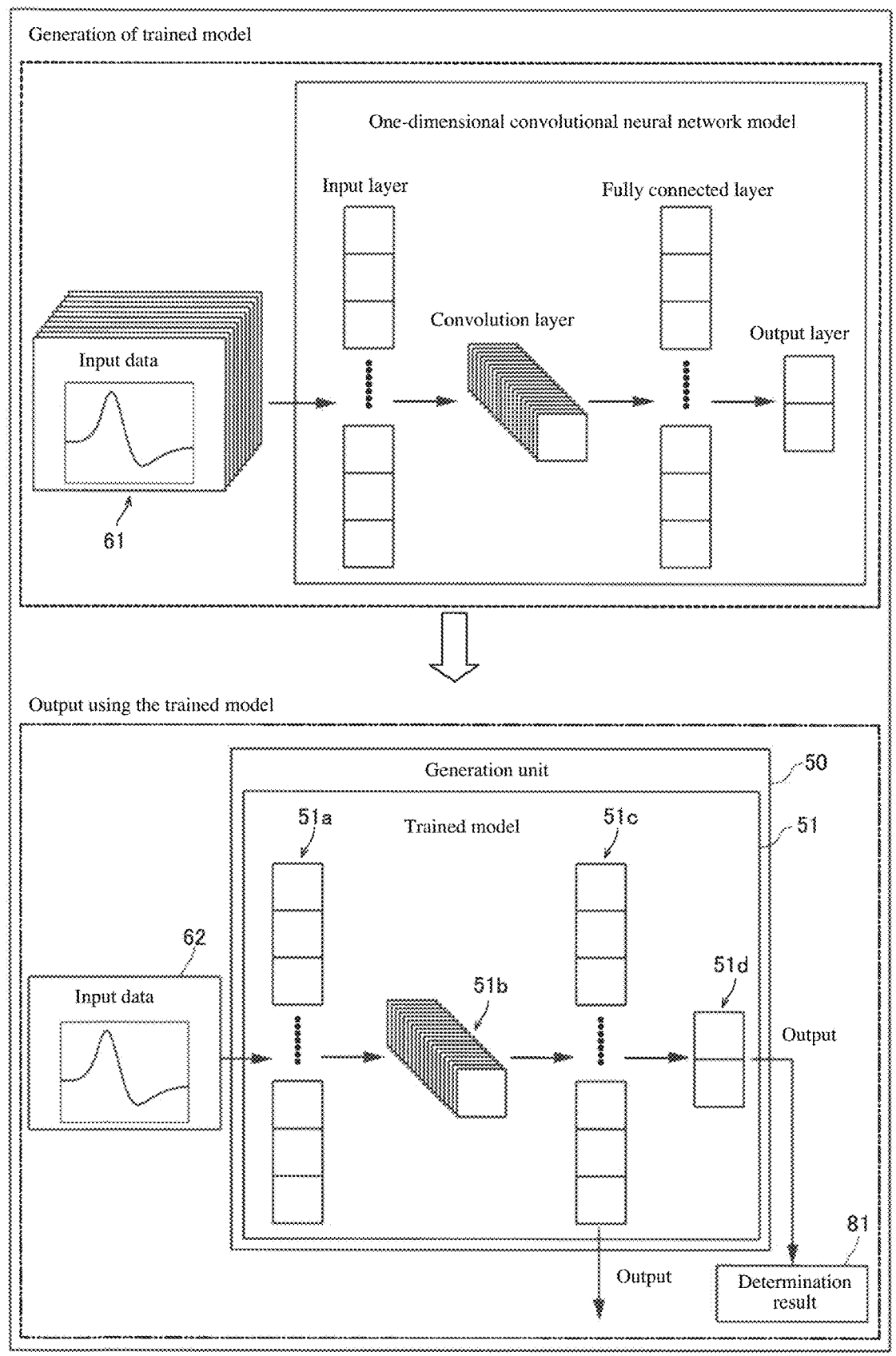
FIG. 3 is a diagram for explaining a trained model according to one embodiment of the present invention.

Referring now to FIG. 3, the trained model 51 of the magnetic detection system 100 according to this embodiment will be described.

The trained model 51 is generated by machine-learning the waveform patterns of the plurality of signals each corresponding to the relative position and the traveling direction of the magnetic body 200 with respect to the plurality of magnetic sensors 1 as input data 61 (see FIG. 3).

For the generation method (learning method) of the trained model 51, a one-dimensional convolutional neural network model (see FIG. 3) including input layers, convolution layers, a fully connected layers, and output layers is used. In this embodiment, the trained model 51 is generated by machine-learning a plurality of simulation waveforms generated by simulating the magnetic signal 11 derived from the magnetic body 200 and a plurality of noise waveforms as input data 61, using a one-dimensional convolutional neural network model.

The plurality of simulation waveforms is generated comprehensively by setting a plurality of parameters to various values. The plurality of parameters includes, for example, the direction of the magnetism, the traveling direction, the velocity, the depth in water, and the transverse distance (the distance in the lateral direction) of the magnetic body 200. The plurality of simulation waveforms is simulated based on four waveform patterns in which the waveform patterns of the magnetic signals 11 pre-processed by the pre-processing unit 33a are roughly classified.

Here, the four waveform patterns in which the waveform patterns of the magnetic signals 11 pre-processed by the pre-processing unit 33a have been roughly classified will be described with reference to FIGS. 4 to 11.

The waveform patterns of the magnetic signals 11 pre-processed by the pre-processing unit 33a are roughly classified into four waveform patterns (FIG. 5, FIG. 7, FIG. 9, and FIG. 11) according to the relative position and the traveling direction (see FIGS. 4, 6, 8, and 10) of the magnetic body 200 with respect to the plurality of magnetic sensors 1. Note that the vertical axis in FIG. 5, FIG. 7, FIG. 9, and FIG. 11 indicates the signal intensity, and the horizontal axis indicates the time. The waveform pattern of the magnetic signal 11 acquired by the magnetic sensor 1 and pre-processed by the pre-processing unit 33a has a correlation between the relative position and the traveling direction of the magnetic body 200 with respect to the plurality of magnetic sensors 1.

Figure 4:
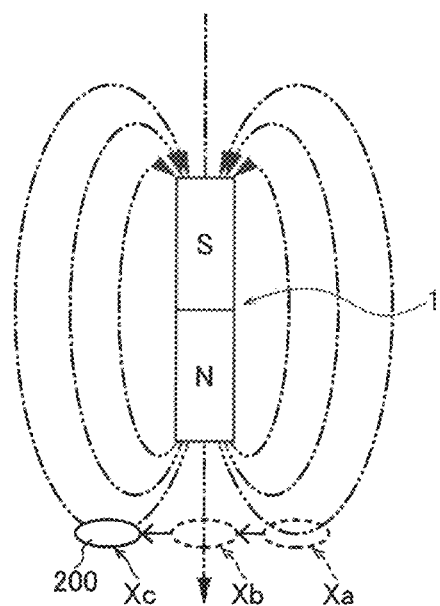
FIG. 4 is a first diagram showing a relative position and a traveling direction of a magnetic body with respect to a magnetic sensor.
Figure 5:
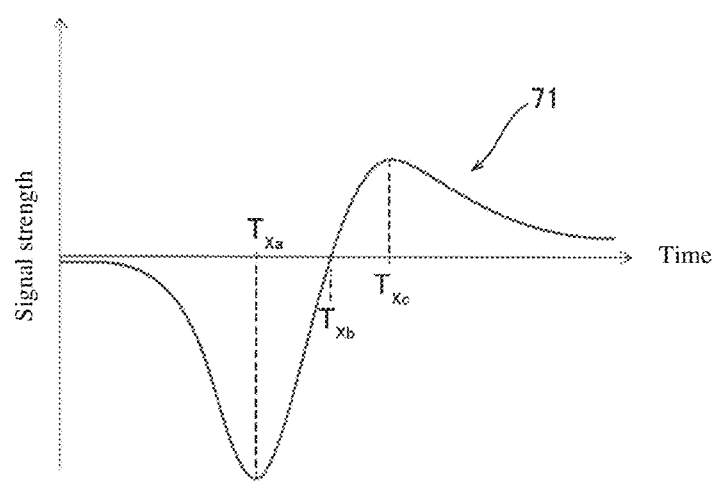
FIG. 5 is a diagram showing a waveform pattern of a magnetic signal acquired by a magnetic sensor when a magnetic body has moved as shown in FIG. 4.

As shown in FIG. 4, the waveform pattern when the magnetic body 200 moves in the order of the positions Xa, Xb, and Xc in a direction perpendicular to the direction in which the N-pole side of the magnetic sensor 1 and the S-pole side thereof 1 are adjacent in a state in which the magnetic sensor 1 is viewed on the right side on the N-pole side of the magnetic sensor 1 becomes a waveform pattern like a first waveform pattern 71 as shown in FIG. 5. Note that in FIG. 5, the time $T_{Xa}$ is a time when the magnetic body 200 is positioned at the position Xa. The time $T_{Xb}$ is a time when the magnetic body 200 is positioned at the position Xb. The time $T_{Xc}$ is a time when the magnetic body 200 is positioned at the position Xc.

Figure 6:
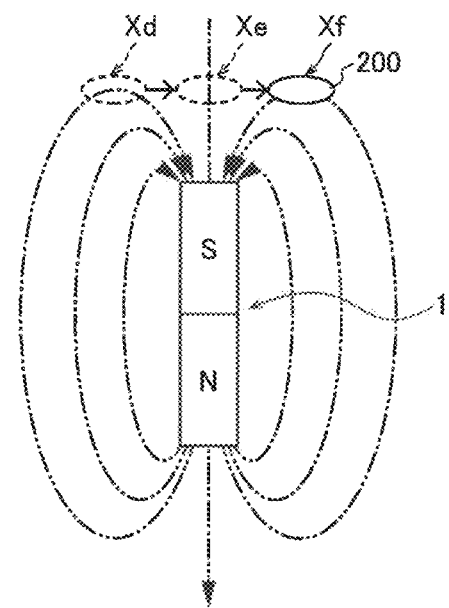
FIG. 6 is a second diagram showing a relative position and a traveling direction of a magnetic body with respect to a magnetic sensor.
Figure 7:
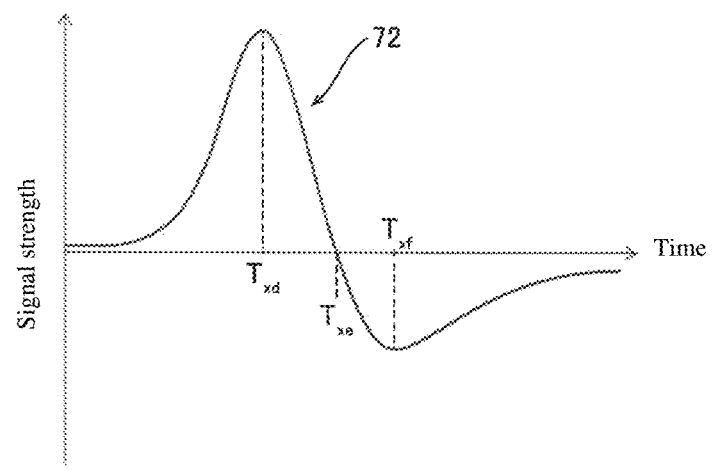
FIG. 7 is a diagram showing a waveform pattern of a magnetic signal acquired by a magnetic sensor when a magnetic body has moved as shown in FIG. 6.

As shown in FIG. 6, the waveform pattern when the magnetic body 200 moves in the order of the positions Xd, Xe, and Xf in a direction perpendicular to the direction in which the N-pole side of the magnetic sensor 1 and the S-pole side thereof are adjacent in a state in which the magnetic sensor 1 is viewed on the right side on the S-pole side of the magnetic sensor 1 becomes a waveform pattern like a second waveform pattern 72 as shown in FIG. 7. Note that FIG. 7, the time $T_{Xd}$ is a time when the magnetic body 200 is positioned at the position Xd. The time $T_{Xe}$ is a time when the magnetic body 200 is positioned at the position Xe. The time $T_{Xf}$ is a time when the magnetic body 200 is positioned at the position Xf.

Figure 8:
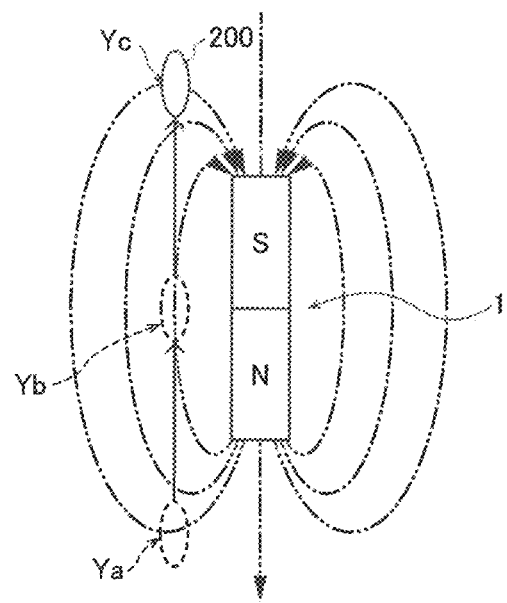
FIG. 8 is a third diagram showing a relative position and a traveling direction of a magnetic body with respect to a magnetic sensor.
Figure 9:
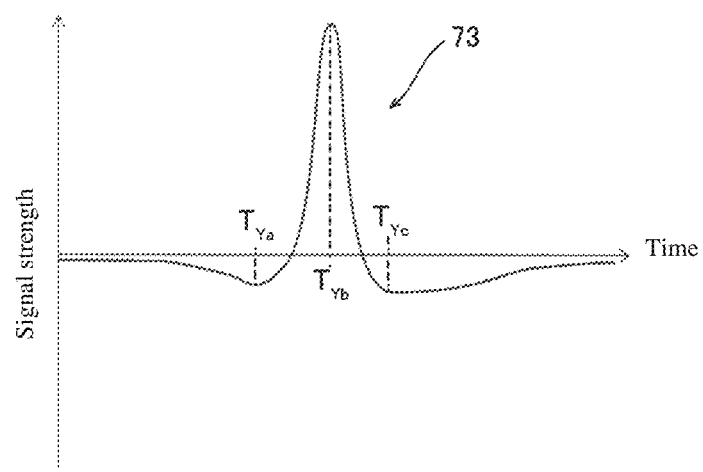
FIG. 9 is a diagram showing a waveform pattern of a magnetic signal acquired by a magnetic sensor when a magnetic body has moved as shown in FIG. 8.

Further, as shown in FIG. 8, the waveform pattern when the magnetic body 200 moves in the order of the positions Ya, Yb, and Yc from the N-pole side of the magnetic sensor 1 to the S-pole side thereof in a direction in which the N-pole side of the magnetic sensor 1 and the S-pole side thereof are adjacent in a state in which the magnetic sensor 1 is viewed on the right side becomes a waveform pattern like a third waveform pattern 73 as shown in FIG. 9. Note that in FIG. 9, the time $T_{Ya}$ is a time when the magnetic body 200 is positioned at the position Ya. The time $T_{Yb}$ is a time when the magnetic body 200 is positioned at the position Yb. The time $T_{Yc}$ is a time when the magnetic body 200 is positioned at the position Yc.

Figure 10:
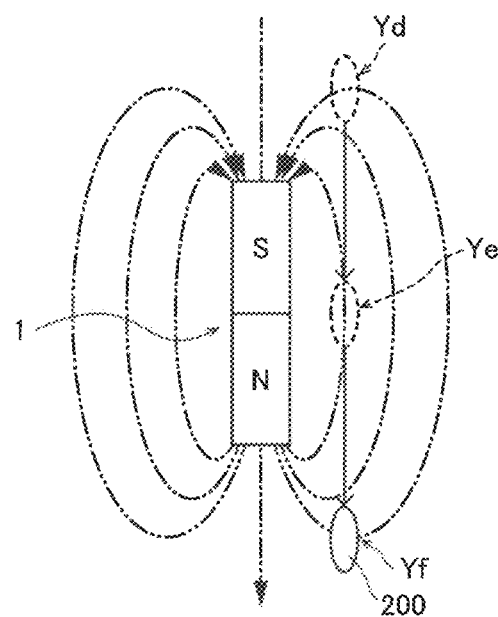
FIG. 10 is a fourth diagram showing a relative position and a traveling direction of a magnetic body with respect to a magnetic sensor.
Figure 11:
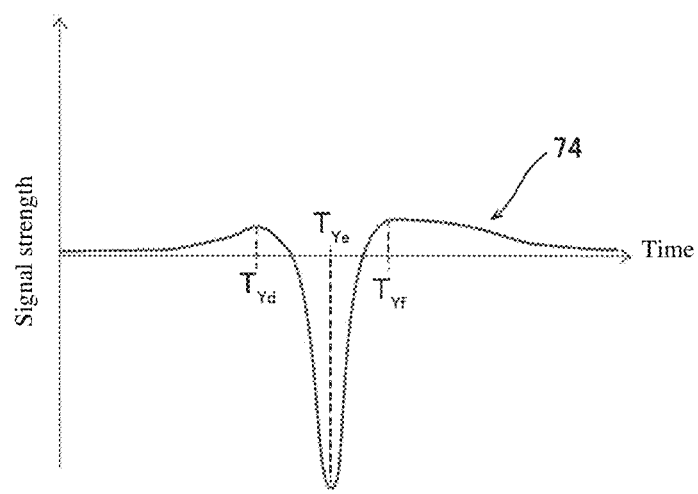
FIG. 11 is a diagram showing a waveform pattern of a magnetic signal acquired by a magnetic sensor when a magnetic body has moved as shown in FIG. 10.

Further, as shown in FIG. 10, the waveform pattern when the magnetic body 200 moves in the order of the positions Yd, Ye, and Yf from the S-pole side of the magnetic sensor 1 to the N-pole side thereof in a direction in which the N-pole side of the magnetic sensor 1 and the S-pole side thereof are adjacent in a state in which the magnetic sensor 1 is viewed on the right side becomes a waveform pattern like a fourth waveform pattern 74 as shown in FIG. 11. Note that in FIG. 11, the time $T_{Yd}$ is a time when the magnetic body 200 is positioned at the position Yd. The time $T_{Ye}$ is a time when the magnetic body 200 is positioned at the position Ye. The time $T_{Yf}$ is a time when the magnetic body 200 is positioned at the position Yf.

Further, the waveform pattern in the relative position and the traveling direction of magnetic body 200 with respect to the magnetic sensor 1 other than those shown in FIGS. 4, 6, 8, and 10 can be calculated, based on the above-described four waveform patterns (the first waveform pattern 71, the second waveform pattern 72, the third waveform pattern 73, and the fourth waveform pattern 74).

In this embodiment, the generation unit 50 is configured to input the magnetic signal 11 acquired by the magnetic sensor 1 to the trained model 51 generated by machine-learning as described above, thereby generating the fully connected layers 51c (see FIG. 3), which are fully connected layers based on the magnetic signal 11 acquired by the magnetic sensor 1, the fully connected layers being generated by weighting and connecting the features in the waveform patterns of the input magnetic signal 11.

Specifically, by inputting the magnetic waveform generated based on the magnetic signal 11 of the magnetic sensor 1 to the trained model 51 as input data 62, the trained model 51 sequentially generates the input layers 51a, the convolution layers 51b, the fully connected layers 51c, and the output layers 51d. Note that the trained model 51 may be configured to generate a pooling layer after the convolution layer 51b, or to generate the convolution layer 51b, the pooling layer, and the fully connected layer 51c plural times. Note that the fully connected layer 51c is an example of the "sensor signal fully connected layer" recited in claims.

The input layer 51a is a layer generated in the input data 62 inputted to the trained model 51. The convolution layer 51b is a layer in which the output from the input layer 51a is convolution-operated. The fully connected layer 51c is a layer (for extracting the feature in the waveform pattern of the magnetic signal 11) generated such that the feature in the waveform pattern of the magnetic signal 11 in the output from the convolution layer 51b is weighted and totally connected. The output layer 51d is a layer for outputting the generated determination result 81 (identification result), based on the output from the fully connected layers 51c. The determination result 81 is outputted as an output from the output layers 51d generated by the trained model 51.

(Waveform Pattern Distribution Generation)

Next, the generation of the waveform pattern distribution 60 will be described with reference to FIG. 12. The waveform pattern distribution 60 is a distribution of the waveform patterns of the plurality of signals used to classify the waveform patterns of the magnetic signals 11 acquired by the magnetic sensors 1 as described above by the classification unit 33c.

The waveform pattern distribution 60 is generated (created) by using the trained model 52. The trained model 52 has been obtained by machine-learning the waveform patterns of the plurality of signals each corresponding to the relative position and the traveling direction of the magnetic body 200 with respect to the magnetic sensor 1, similarly to the trained model 51, as input data 61 (see FIG. 12). Specifically, the trained model 52 is a model in which the plurality of simulation waveforms generated by simulating the magnetic signals 11 due to the magnetic bodys 200 and the plurality of noise waveforms have been machine-learned as input data 61. That is, the trained model 52 is a one-dimensional convolutional neural network model generated by machine-learning in the same manner as in the trained model 51.

The waveform pattern distribution 60 is generated by using the machine-learned trained model 52 in which the plurality of fully connected layers 52c in which the respective features in the waveform patterns of the plurality of signals are weighted and connected for each waveform pattern has been machine-learned using the waveforms patterns of the plurality of signals each corresponding to the relative position and the traveling direction of the magnetic body 200 with respect to the magnetic sensor 1 as input data 61. Note that the plurality of fully connected layers 52c for generating the waveform pattern distribution 60 may be generated by the trained model 51.

Specifically, each of the waveform patterns (a plurality of simulation waveforms) of the plurality of signals each corresponding to the relative position and the traveling direction of the magnetic body 200 with respect to the magnetic sensor 1 is inputted as input data 61 to the trained model 52. By inputting the waveform patterns of the plurality of signals (a plurality of simulation waveforms) as input data 61, the trained model 52 sequentially generates a plurality of input layers 52a, convolution layers 52b, and fully connected layers 52c, and output layers 52d, respectively.

In each of the generated plurality of fully connected layers 52c, the outputs from the convolution layers 52b are fully connected in a state in which the feature in each waveform pattern is weighted. That is, in each of the plurality of generated fully connected layers 52c, the features in the respective waveform patterns (a plurality of simulation waveforms) of the plurality of signals inputted as input data 61 have been weighted. Note that the plurality of fully connected layers 52c is an example of the "plurality of fully connected layers" recited in claims.

Then, the waveform pattern distribution 60 is generated by dimensionally compressing the output from each of the plurality of fully connected layers 52c.

Specifically, first, the output from each of the plurality of fully connected layers 52c generated by using the trained model 51 is two-dimensionally compressed. Then, by showing the plurality of acquired dimensional compression results 80 in two dimensions together, the waveform pattern distribution 60 (see FIG. 13), which is a distribution (distribution of the waveform patterns of the plurality of signals) of the plurality of dimensional compression results 80 is generated. Note that, when dimensionally compressing the output from each of the plurality of fully connected layers 52c, a method (similar dimensional compression algorithm) similar to the method of the dimensional compression (FIG. 17) of the fully connected layer 51c by a dimensional compression unit 33b, which will be described later, is used.
(Configuration of Waveform Pattern Distribution)

Figure 13:
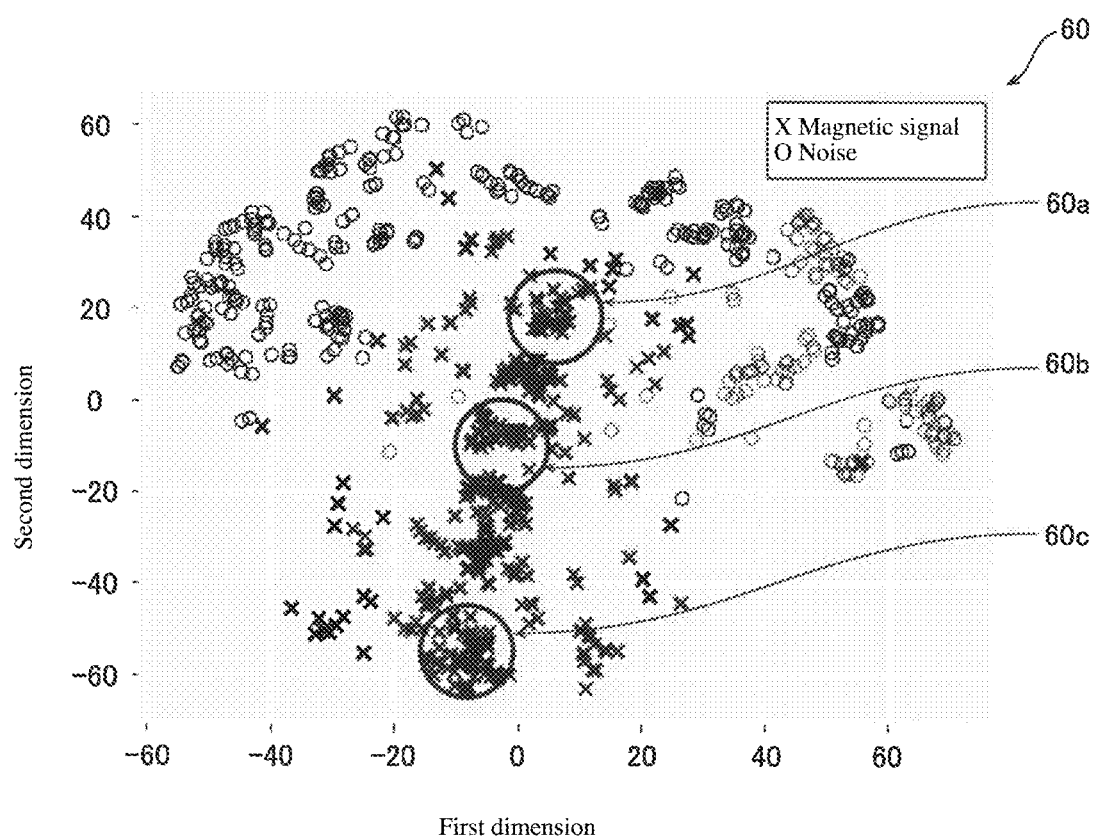
FIG. 13 is an example of a waveform pattern distribution generated by a trained model.

An example of the waveform pattern distribution 60 generated by the method described above is shown in FIG. 13. Note that the distribution of the plurality of simulation waveforms generated by simulating the magnetic signals 11 derived from the magnetic body 200 is marked with a cross (×) mark, and the distribution of the plurality of noise waveforms is indicated by a circle (○) mark. The waveform pattern distribution 60 is represented in two dimensions. The horizontal axis of FIG. 13 represents a first dimension (one dimension), while the vertical axis represents a second dimension (the other dimension). As will be described later, in the distribution ranges 60a, 60b, and 60c shown in FIG. 13, the respectively distributed waveform patterns are different from each other. Note that the distribution ranges 60a, 60b, and 60c are examples of the "set distribution range" category recited in claims.

Figure 14:
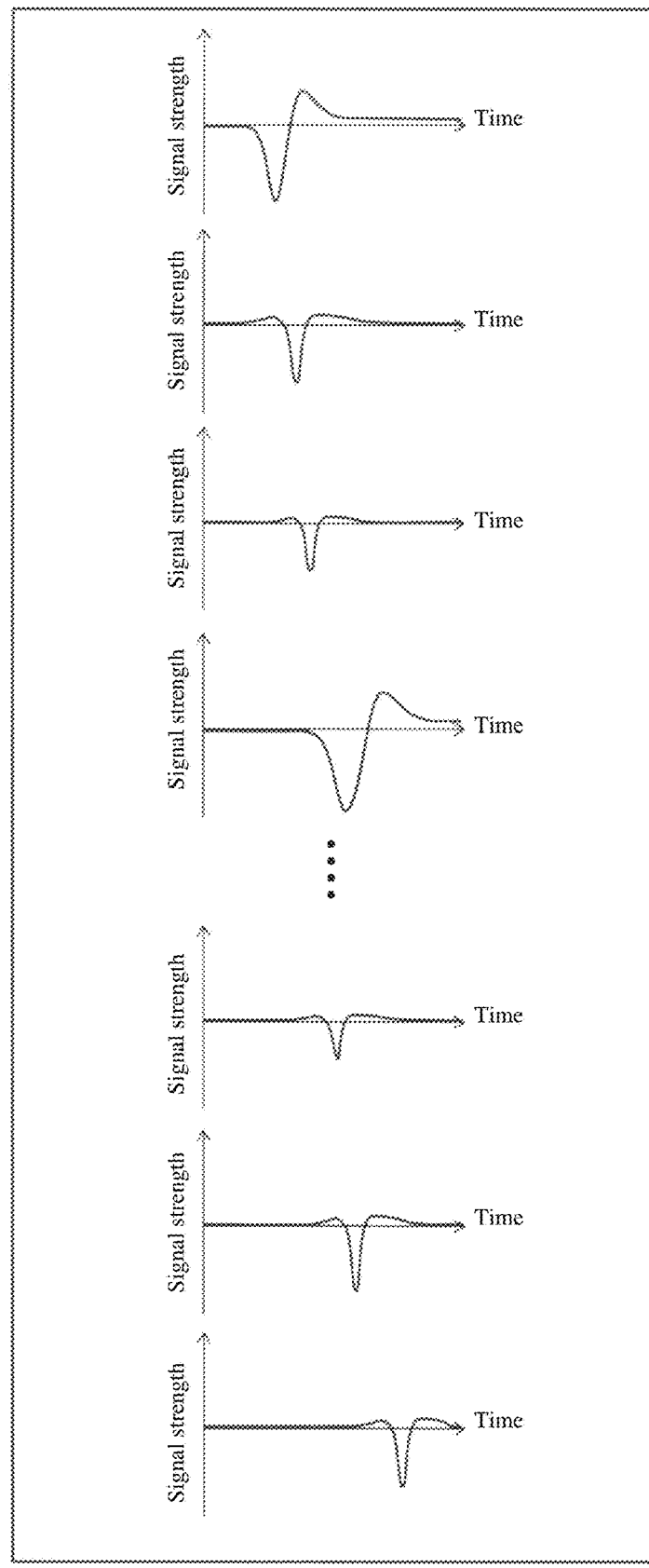
FIG. 14 is a first diagram showing waveform patterns in a waveform pattern distribution.

In the distribution range 60a, as shown in FIG. 14, many waveform patterns each having the waveform pattern similar to the fourth waveform pattern 74 (see FIG. 11) are distributed. Further, in the distribution range 60a, the waveform pattern similar to the first waveform pattern 71 (see FIG. 5) is partially distributed.

Figure 15:
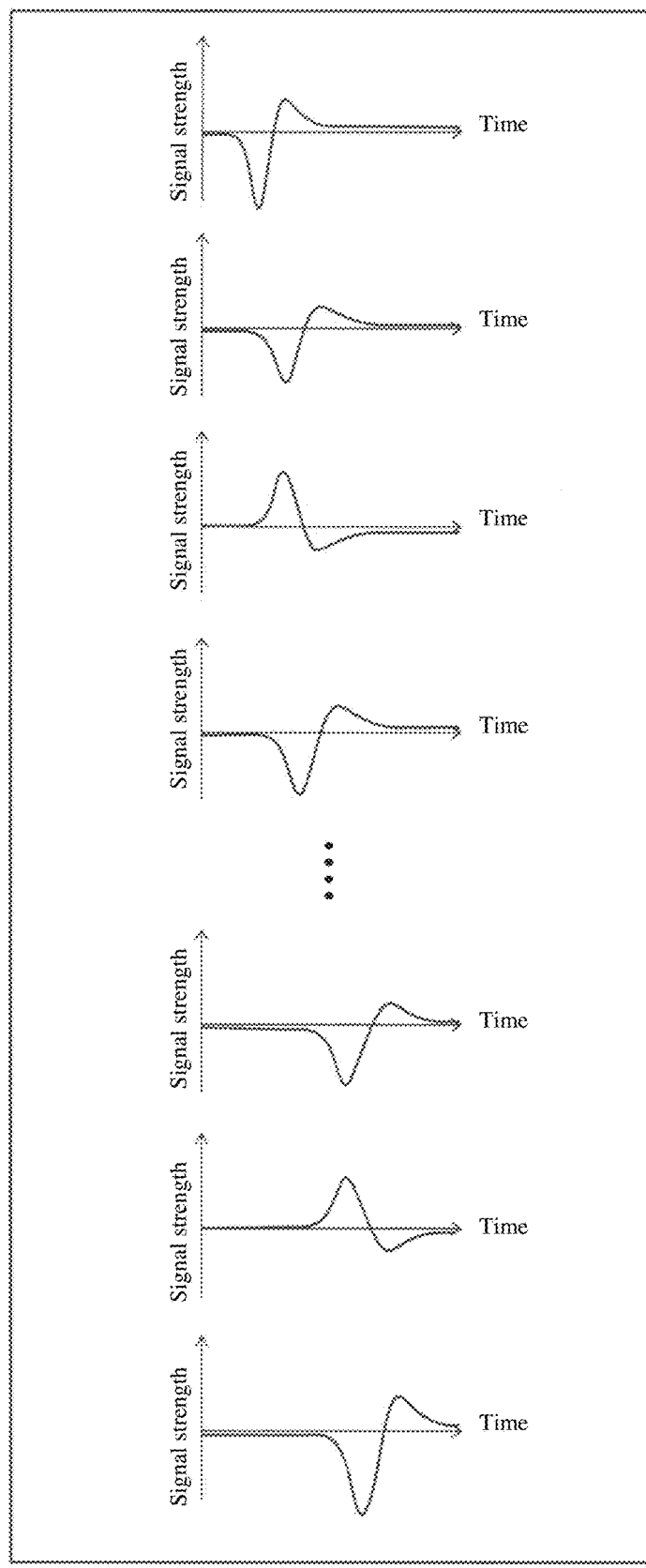
FIG. 15 is a second diagram showing waveform patterns in a waveform pattern distribution.

Further, in the distribution range 60b, as shown in FIG. 15, a waveform pattern having the waveform pattern similar to the first waveform pattern 71 (see FIG. 5) and a waveform pattern having the waveform pattern similar to the second waveform pattern 72 (see FIG. 7) are distributed.

Figure 16:
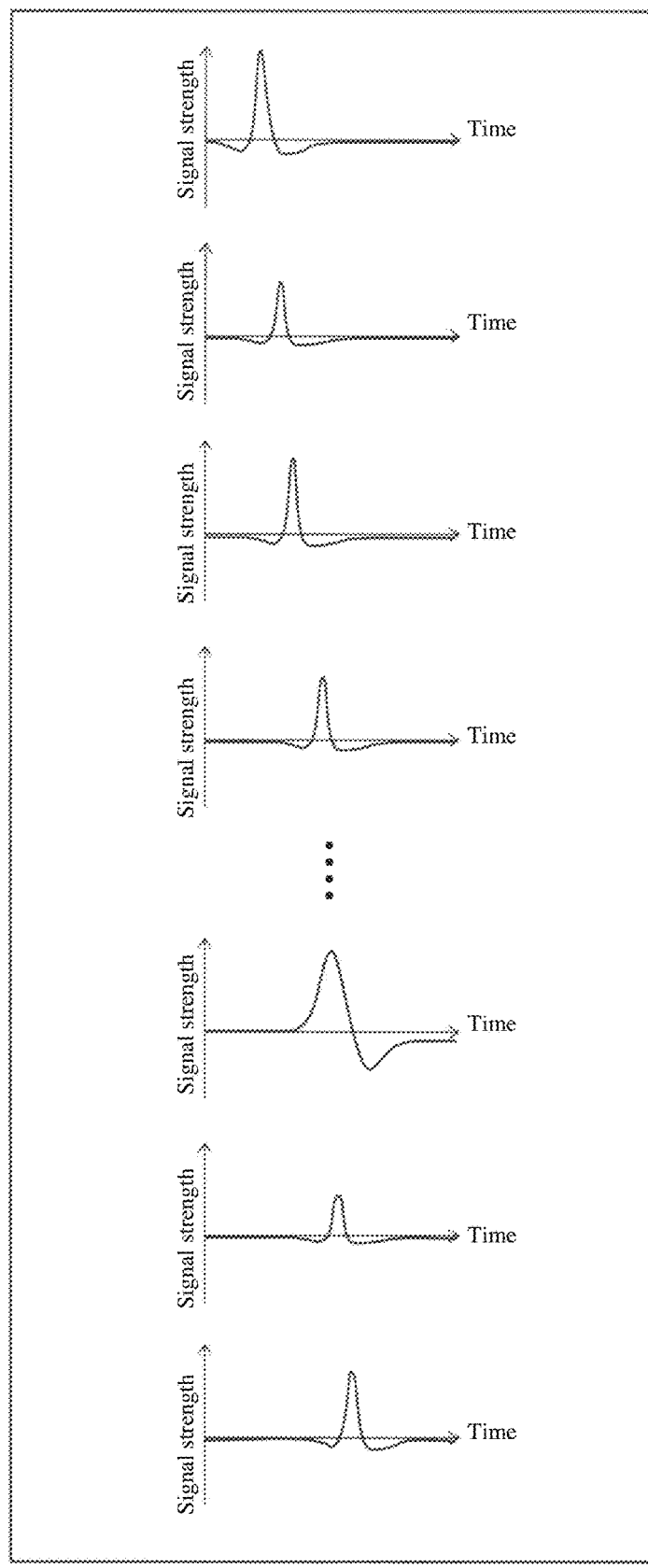
FIG. 16 is a third diagram showing waveform patterns in a waveform pattern distribution.

Further, in the distribution range 60c, as shown in FIG. 16, many waveform patterns having the waveform pattern similar to the third waveform pattern 73 (see FIG. 9) are distributed. Further, in the distribution range 60a, the waveform pattern similar to the second waveform pattern 72 (see FIG. 7) is also partially distributed.

That is, the distribution of the first waveform pattern 71 (see FIG. 5), the second waveform pattern 72 (see FIG. 7), the third waveform pattern 73 (see FIG. 9), and the fourth waveform pattern 74 (see FIG. 11) is arranged such that the adjacent distributions are partially overlapped in the order of the fourth waveform pattern 74, the first waveform pattern 71, the second waveform pattern 72, and the third waveform pattern 73. By classifying the waveform patterns by using the tendency of the distribution of the waveform pattern distribution 60 and utilizing the correlation between the classified waveform pattern and the relative position and the traveling direction of the magnetic body 200 with respect to the magnetic sensor 1, it becomes possible to estimate the traveling direction of the magnetic body 200.

Note that the tendency of the distribution of the waveform pattern distribution 60 shown in FIGS. 13 to 16 is an example. The tendency of the distribution of the waveform pattern distribution 60 tends to differ depending on the content of the input data 61 inputted at the time of the learning of the trained model 52 and the value of weighting when generating the plurality of fully connected layers 52c using the trained model 52.

Also, based on the features of the waveform patterns such as the above-described roughly classified four waveform patterns (the waveform pattern 71, the second waveform pattern 72, the third waveform pattern 73, and the fourth waveform pattern 74), the distribution ranges (e.g., the distribution ranges 60a, 60b, and 60c) of the waveform patterns used to classify the waveform patterns by the classification unit 33c are determined.

Then, in this embodiment, the magnetic detection system 100 classifies the waveform pattern of the magnetic signal 11 acquired by magnetic sensor 1 and inputted to the generation unit 50 by setting the distribution ranges (the distribution ranges 60a, 60b, and 60c) based on the features of the waveform patterns in the waveform pattern distribution 60. For example, in a case where in the waveform pattern distribution 60, the distribution range 60c (see FIG. 13) is set as the distribution range 60c in which the waveform pattern similar to the third waveform pattern 73 (see FIG. 9) is distributed, when the result based on the magnetic signal 11 acquired by the magnetic sensor 1 falls within the distribution range 60c, the waveform pattern of the magnetic signal 11 is classified as the waveform pattern similar to the third waveform pattern 73. The distribution ranges 60a, 60b, and 60c can be arbitrarily set by the generator of the waveform pattern distribution 60 and the user, in the two-dimensional waveform pattern distribution 60.

Further, the shape of the distribution range set in the waveform pattern distribution 60 includes various shapes represented in two dimensions, such as, e.g., a circular shape, a triangular shape, and a rectangular shape. The number of the distribution ranges of the waveform patterns may be one or plural.

(Configuration for Determination, Classification, and Estimation by Magnetic Detection System)

Figure 17:
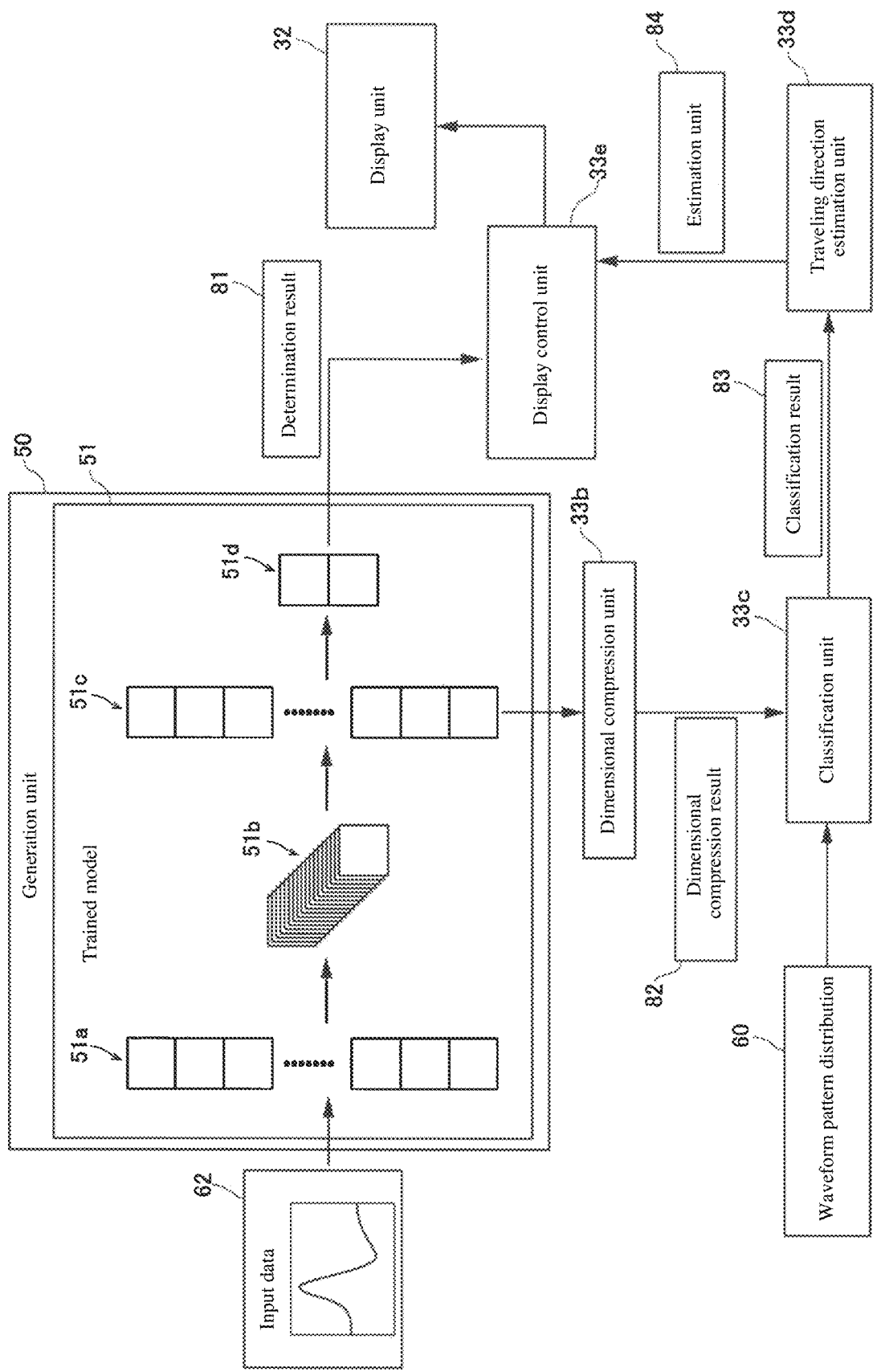
FIG. 17 is a diagram showing an example of a determination and a classification of a waveform pattern by a magnetic detection system according to one embodiment of the present invention.

Next, the determination of the magnetic signal 11, the classification of the waveform pattern, and the estimation of the traveling direction of the magnetic body 200 by the magnetic detection system 100 of this embodiment will be described with reference to FIG. 17.

The trained model 51 sequentially generates the input layers 51a, the convolution layers 51b, the fully connected layers 51c, and the output layers 51d by inputting the magnetic waveform generated based on the magnetic signal 11 acquired by the magnetic sensor 1 to the trained model 51 in the generation unit 50 as input data 62.

The trained model 51 is configured to output the determination result 81 based on the magnetic signals 11 acquired in a pre-set determination period by the plurality of magnetic sensors 1. Specifically, the trained model 51 inputs the magnetic waveform generated based on the magnetic signal 11 acquired at the time back 12 minutes from the acquisition time of the magnetic signal 11 as input data 62, every 0.5 seconds of acquiring the magnetic signal 11.

When the input data 62 is inputted, a determination result 81 is outputted from the output layers 51d generated by the trained model 51. The trained model 51 outputs the determination result 81 based on the magnetic signal 11 acquired (acquired 1,400 times) in 12 minutes, which is a pre-set determination period. Note that the determination period can be arbitrarily changed.

The determination result 81 is a numerical value representing the accuracy of whether or not the acquired magnetic signal 11 is derived from the approach of the magnetic body 200. The determination result 81 is represented by a number between 0 and 1. Note that the determination result 81 indicates that as the number is closer to 1, there is a high possibility that the magnetic signal 11 is derived from the approach of the magnetic body 200, and as the number is closer to 0, there is a high possibility that the magnetic signal 11 is derived from noise. The determination result 81, which is the output from the output layers 51d generated by the trained model 51, is inputted to the display control unit 33e to be used to control the display of the display unit 32 by the display control unit 33e.

The outputs from the fully connected layers 51c generated by the trained model 51 are used to classify the waveform patterns by the classification unit 33c. The outputs from the fully connected layers 51c are inputted to the dimensional compression unit 33b. The dimensional compression unit 33b is configured to perform dimensional compression with respect to the outputs from the fully connected layers 51c generated by the trained model 51. The outputs from the inputted fully connected layers 51c are compressed by means of a dimensional compression algorithm. The outputs from the fully connected layers 51c are, for example, 20-dimensional data. The dimensional compression unit 33b dimensionally compresses the outputs of the fully connected layers 51c into two-dimensional data. The dimensional compression result 82, which is the result of compressing the outputs of the fully connected layers 51c, is inputted to the classification unit 33c.

The classification unit 33c is configured to classify the waveform patterns of the magnetic signals 11 acquired by the plurality of magnetic sensors 1, based on the dimensional compression result 82, which is the result of dimensionally compressing the outputs from the fully connected layers 51c generated by the generation unit 50, and the waveform pattern distribution 60. The dimensional compression result 82 includes the features in the waveform patterns of the magnetic signals 11 of the fully connected layers 51c.

The classification unit 33c classifies the waveform patterns of the magnetic signals 11 acquired by the plurality of magnetic sensors 1 and inputted to the generation unit 50, based on the dimensional compression result 82 that is dimensionally compressed in two dimensions and the distribution ranges (the distribution ranges 60a, 60b, and 60c) set in the two-dimensional waveform pattern distribution 60 generated by two-dimensionally compressing the output from each of the plurality of fully connected layers 52c. The classification unit 33c is configured to associate the waveform patterns with the distribution ranges set in the waveform pattern distribution 60 and classify the waveform patterns of the input magnetic signals 11 into set waveform patterns when the dimensional compression result 82 is distributed in the set distribution ranges to thereby output the classification result 83. For example, in a case where the distribution range 60c (see FIG. 13) is associated with the third waveform pattern 73 (see FIG. 9) and the dimensional compression result 82 is distributed in the distribution range 60c, the classification unit classifies the waveform pattern of the inputted magnetic signal 11 as the third waveform pattern 73.

Further, for example, when the dimensional compression result 82 is distributed in the distribution range 60c, the classification unit 33c may output the classification result 83 of the waveform patterns by the probability such that the probability of the third waveform pattern 73 (see FIG. 9) is 70 percent, the probability of the second waveform pattern 72 (see FIG. 7) is 20 percent, and the probability of the first waveform pattern 71 (see FIG. 5) is 10 percent.

Then, the classification result 83 for the waveform pattern of the magnetic signal 11 inputted to the generation unit 50 classified by the classification unit 33c is outputted. The classification result 83 is inputted to the traveling direction estimation unit 33d.

The traveling direction estimation unit 33d is configured to estimate the traveling direction of the magnetic body 200 with respect to the magnetic sensor 1 based on the inputted classification result 83. The traveling direction estimation unit 33d acquires that the waveform pattern of the magnetic signal 11 inputted from the classification result 83 was classified into what waveform pattern. The traveling direction estimation unit 33d estimates the relative position and the waveform pattern of the magnetic body 200 with respect to the magnetic sensor 1 from the correlation between the classified waveform pattern and the relative position and the traveling direction of the magnetic body 200 with respect to the magnetic sensor 1, and outputs the estimation result 84. For example, in a case where the waveform pattern of the input magnetic signal 11 is classified as the third waveform pattern 73 (see FIG. 9), the traveling direction estimation unit 33d estimates that the magnetic body 200 is moving from the N-pole side of the magnetic sensor 1 to the S-pole side thereof in a direction in which the N-pole side of the magnetic sensor 1 and the S-pole side thereof are adjacent in a state in which the magnetic sensor 1 is viewed on the right side.

Note that in a case where the magnetic sensor 1 is a sensor for acquiring the magnetic signal 11 in a plurality of axial directions, such as, e.g., three axes (X-axis, Y-axis, and Z-axis), as the input data 62 to be inputted to the trained model 51, the magnetic waveform generated based on the magnetic signal 11 for each axis of the three axes (X-axis, Y-axis, and, Z-axis) of a single magnetic sensor 1 may be inputted. Alternatively, a magnetic waveform generated based on a signal acquired by combining the magnetic signals 11 in all of the plural axis directions may be inputted. Alternatively, the magnetic waveform generated based on the signal acquired by combining the magnetic signals 11 of the plurality of magnetic sensors 1 may be inputted as the input data 62 to be inputted to the trained model 51.

Further, the traveling direction estimation unit 33d may estimate the position of the magnetic body 200 and may estimate the traveling direction of the magnetic body 200, from the plurality of estimation results 84 based on the magnetic signals 11 acquired from the plurality of magnetic sensors 1 different from each other.

Further, the outputs of the determination result 81, the classification result 83, and the estimation result 84 are performed every 0.5 seconds of inputting the input data 62. The outputted determination result 81 and estimation result 84 are inputted to the display control unit 33e.

Note that the processing time from the input of the input data 62 to the calculation of the estimation result 84 varies depending on the processing speed of the CPU and the GPU used for the processing. In the case of simultaneously processing the input data 62 from 100 channels (100 magnetic sensors 1), it is about 5 milliseconds or more and 50 milliseconds or less.

Then, the display control unit 33e performs the display control of the display unit 32, based on the inputted determination result 81 and estimation result 84.

(Display of Estimation Result and Determination Result)

Next, with reference to FIGS. 18 and 19, an example of the display of the estimation result 84 and the determination result 81 by the display unit 32 will be described.

The display unit 32 displays a magnetic signal display 90a displaying the magnetic signal 11 and the determination result display 90b showing the determination result 81 of the magnetic signal 11. The determination result display 90b displays the determination result 81 together with the determined numerical value. For example, in a case where the magnetic signal 11 is derived from the approach of the magnetic body 200, "Signal" is displayed (see FIG. 18), and the determined number "0.75" is displayed (see FIG. 18). Further, in a case where the magnetic signal 11 acquired by the magnetic sensor 1 is derived from noise, "Noise" may be displayed.

Further, the display control unit 33e performs control to display the warning display 90c and the approaching display 90d (see FIG. 18) in a case where the estimation result 84 estimating the approach of the magnetic body 200 is inputted. The warning display 90c displays, for example, characters, such as, e.g., "EMERGENCY" to alert the user (see FIG. 18). The approaching display 90d displays characters, such as, e.g., "Approaching" to notify the user of the approach of the magnetic body 200 (see FIG. 18). The warning display 90c and the approaching display 90d may blink so as to be easily recognized by the user.

Figure 18:
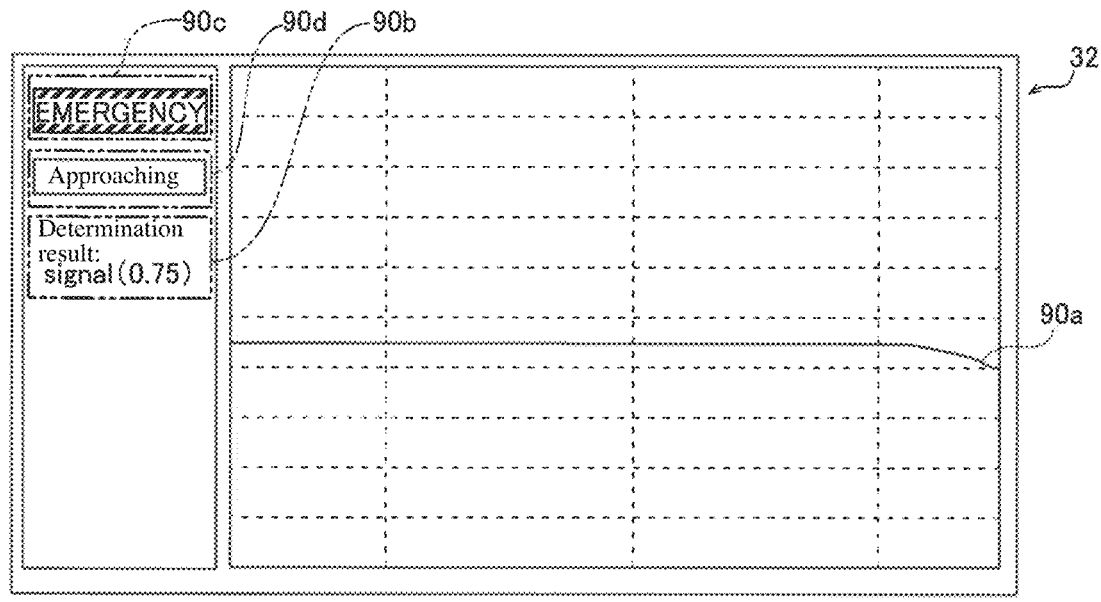
FIG. 18 is a first diagram showing an example of a display of a determination result and an estimation result by a display unit.
Figure 19:
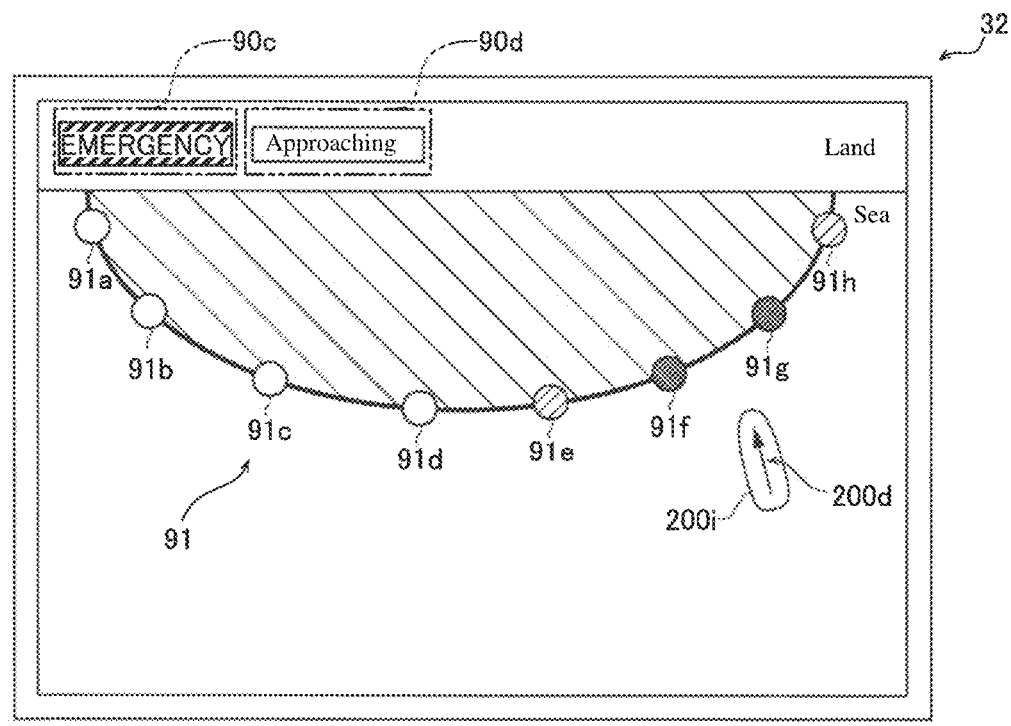
FIG. 19 is a second diagram showing an example of a display of a determination result and an estimation result by a display unit.

Further, as a display method of the estimation result 84 that differs from FIG. 18, the display control unit 33e may display the estimation result 84 as shown in FIG. 19.

As shown in FIG. 19, icons 91 (icons 91a, 92b, 91c, 91d, 91e, 91f, 91g, and 91h) showing the plurality of magnetic sensors 1 are displayed on the display unit 32. The icons 91a, 92b, 91c, 91d, 91e, 91f, 91g, and 91h are the first magnetic sensor 1a, the second magnetic sensor 1b, the third magnetic sensor 1c, the fourth magnetic sensor 1d, the fifth magnetic sensor 1e, the sixth magnetic sensor 1f, the seventh magnetic sensor 1g, and the eighth magnetic sensor 1h, respectively, in this order.

The icon 200i is an icon indicating the estimated position of the magnetic body 200 with respect to the magnetic sensors 1. The traveling direction 200d is an icon showing the estimation result 84 of the traveling direction of the magnetic body 200 with respect to the magnetic sensors 1. Note that the estimated position of the magnetic body 200 with respect to the magnetic sensors 1 is calculated from the correlation between the classified waveform patterns and the relative position and the traveling direction of the magnetic body 200 with respect to the magnetic sensors 1.

The display control unit 33e is configured to perform control to change the display color of the icons (icons 91a, 92b, 91c, 91d, 91e, 91f, 91g, and 91h) indicating the positions of the plurality of magnetic sensors 1 according to the distance between the estimated position of the magnetic body 200 and the magnetic sensor 1. For example, as shown in FIG. 19, the display control unit 33e controls the display so as to change the display color of the magnetic sensor 1 in which the distance between the estimated position of the magnetic body 200 and the magnetic sensor 1 is close (shown by the hatching in FIG. 19).

(Waveform Pattern Distribution Generation Processing)

Figure 20:
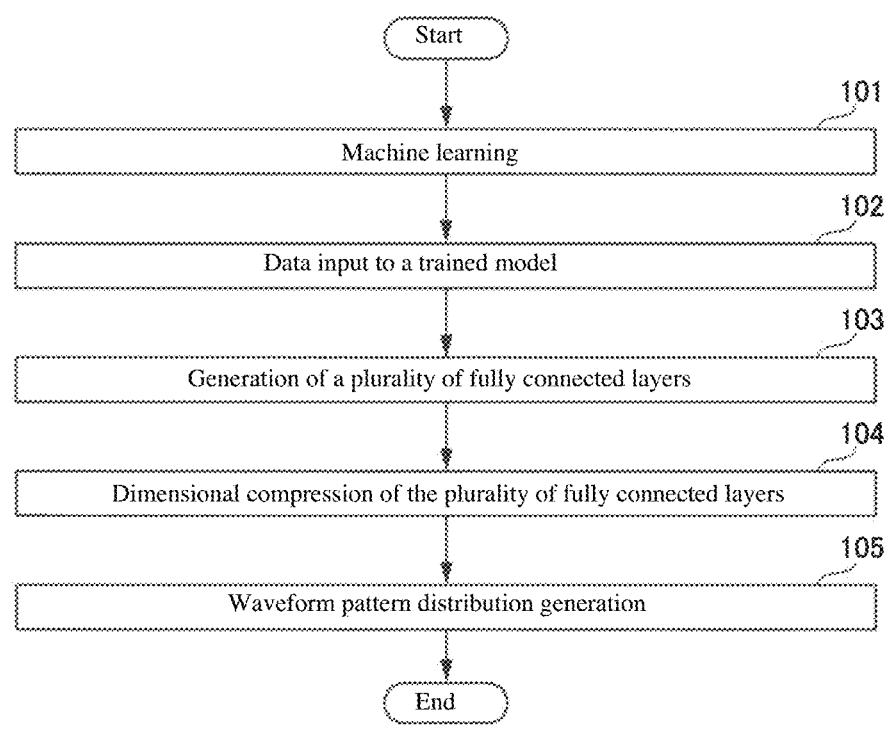
FIG. 20 is a flowchart showing an example of waveform pattern distribution generation processing performed by one embodiment of the present invention.

Next, with reference to FIG. 20, the waveform pattern distribution generation processing of this embodiment will be described based on a flowchart.

In Step 101, machine-learning is performed. Specifically, machine-learning is performed in which the waveform patterns of the plurality of signals each corresponding to the relative position and the traveling direction of the magnetic body 200 with respect to the magnetic sensor 1 are used as input data 61. After generating the trained model 52 by the machine-learning, the processing step proceeds to Step 102.

In Step 102, data is inputted to the trained model 52. Specifically, in Step 101, waveform patterns of a plurality of signals each corresponding to the relative position and the traveling direction of the magnetic body 200 with respect to the magnetic sensor 1 are inputted to the trained model 52, which has been machine-learned. After completion of the input data with respect to the trained model 52, the processing step proceeds to Step 103.

In Step 103, a plurality of fully connected layers 52c is generated. Specifically, a plurality of fully connected layers 52c in which respective features in the waveform patterns of the plurality of signals are weighted and connected for each waveform pattern in accordance with the plurality of input data 61 inputted as the waveform patterns of the plurality of signals each corresponding to the relative position and the traveling direction of the magnetic body 200 with respect to the magnetic sensor 1 by using the machine-learned trained model 52. After generating the plurality of fully connected layers 52c, the processing step proceeds Step 104.

In Step 104, the plurality of fully connected layers 52c is dimensionally compressed. Specifically, the outputs of the plurality of fully connected layers 52c generated by the trained model 51 are each subjected to dimensional compression processing by means of a dimensional compression algorithm. The outputs of the plurality of fully connected layers 52c are each two-dimensionally compressed. After completing the dimensional compression of the plurality of fully connected layers 52c, the processing step proceeds to Step 104.

In Step 105, a waveform pattern distribution 60 is generated. Specifically, by collectively generating the distribution in two dimensions of each of the plurality of fully connected layers 52c compressed two-dimensionally into one distribution, the waveform pattern distribution 60, which is a distribution of the waveform patterns of the plurality of signals, is generated. Thus, based on the plurality of fully connected layers 52c, the waveform pattern distribution 60 used to classify the waveform patterns of the magnetic signals 11 acquired by the magnetic sensors 1 is generated, and the waveform pattern distribution generation processing is completed.

(Traveling Direction Estimation Processing)

Figure 21:
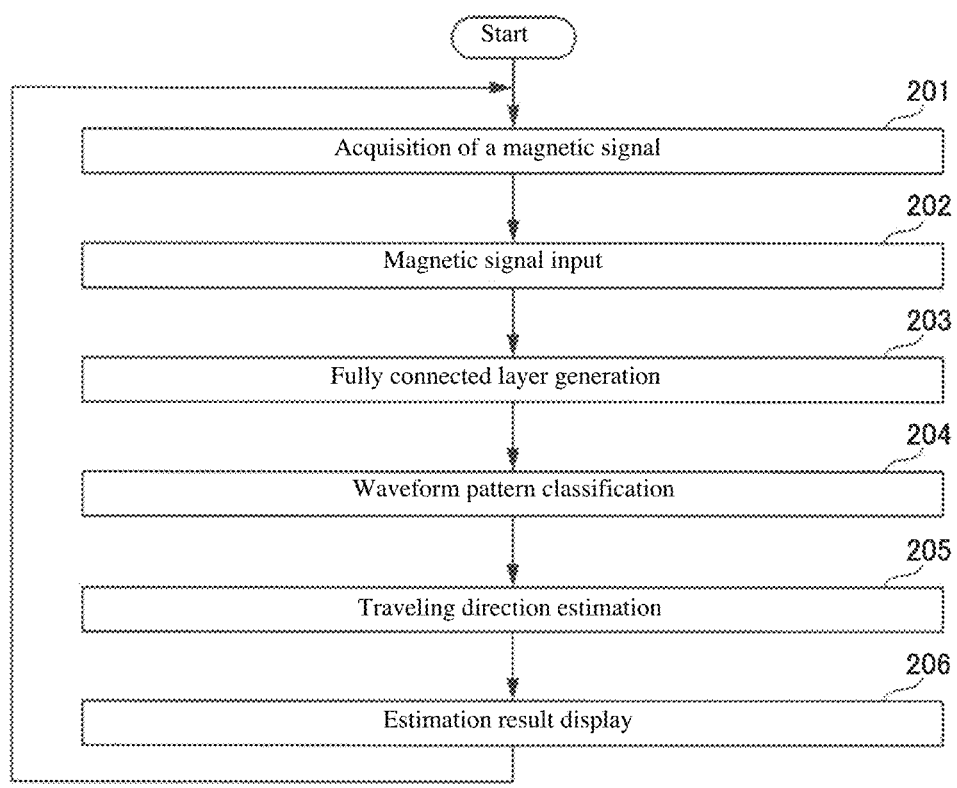
FIG. 21 is a flowchart showing an example of traveling direction estimation processing according to one embodiment of the present invention.

Next, with reference to FIG. 21, the traveling direction estimation processing according to the magnetic detection system 100 of this embodiment will be described based on a flowchart.

In Step 201, a magnetic signal 11 is acquired. Specifically, the magnetic detection system 100 acquires the magnetic signals 11 by the magnetic sensors 1 provided in water. After acquiring the magnetic signals 11, the processing step proceeds to Step 202.

In Step 202, the magnetic signals 11 are inputted. Specifically, the magnetic detection system 100 inputs the magnetic waveforms generated based on the magnetic signals 11 acquired by the magnetic sensors 1 to the trained model 51 in which the waveform patterns of the plurality of signals each corresponding to the relative position and the traveling direction of the magnetic body 200 with respect to the magnetic sensor 1 as the input data 62. After inputting the input data 62 to the trained model 51, the processing step proceeds to Step 203.

In Step 203, the fully connected layers 51c are generated. Specifically, the trained model 51 sequentially generates the input layers 51a, the convolution layers 51b, the fully connected layers 51c, and the output layers 51d, based on the input data 62. The magnetic detection system 100 generates the fully connected layers 51c in which the features in the waveform patterns of the magnetic signals 11 acquired by the magnetic sensors 1 and inputted to the trained model 51, using the trained model 51. After generating the fully connected layers 51c, the processing step proceeds to Step 204.

In Step 204, the waveform patterns are classified. Specifically, the classification unit 33c of the magnetic detection system 100 classifies the waveform patterns of the magnetic signals 11 acquired by the magnetic sensors 1 based on the waveform pattern distribution 60 and the fully connected layers 51c. After classifying the waveform patterns, the classification result 83 is outputted, and the processing step proceeds to Step 205.

In Step 205, the traveling direction of the magnetic body 200 is estimated. Specifically, the traveling direction estimation unit 33d of the magnetic detection system 100 estimates the traveling direction of the magnetic body 200 with respect to the magnetic sensors 1, based on the classification (classification result 83) of the waveform patterns of the magnetic signals 11 acquired by the magnetic sensors 1. After estimating the traveling direction of the magnetic body 200, the estimation result 84 is outputted, and the processing step proceeds to Step 206.

In Step 206, the estimation result 84 is displayed. Specifically, the estimation result 84 outputted in Step 205 is inputted to the display control unit 33e. Based on the input estimation result 84, the display control unit 33e performs the display control of the display unit 32. After the estimation result 84 is displayed on the display unit 32, the processing step returns to Step 201.

(Effects of Magnetic Detection System of this Embodiment)

In the magnetic detection system 100 of this embodiment, the following effects can be obtained.

The magnetic detection system 100 according to this embodiment is configured to classify the waveform patterns of the magnetic signals 11 acquired by the magnetic sensors 1, based on the waveform pattern distribution 60 and the features in the waveform patterns of the magnetic signals 11 acquired by the magnetic sensors 1, by the classification unit 33c (waveform pattern classification unit). Thus, it is possible to classify the waveform patterns of the magnetic signals 11 acquired by the magnetic sensors 1 from the features in the waveform patterns of the magnetic signals 11 acquired by the magnetic sensors 1 using the waveform pattern distribution 60 generated based on the plurality of fully connected layers 52c generated by weighting the respective characteristics in the waveform patterns of the plurality of signals for each waveform pattern. There is a correlation between the waveform pattern of the magnetic signal 11 and the relative position and the traveling direction of the magnetic body 200 with respect to the magnetic sensor 1. Therefore, based on the classification result 83 of the waveform patterns of the magnetic signals 11, it is possible to determine the relative position and the traveling direction of the magnetic body 200 with respect to the magnetic sensors 1. Consequently, it is possible to provide the magnetic detection system 100 capable of determining the traveling direction of the magnetic body 200 from the magnetic signals 11 acquired by the magnetic sensors 1.

Further, in the magnetic detection system 100 according to the above-described embodiment, the following further effects can be obtained by the following configuration.

In the magnetic detection system 100 according to this embodiment, the traveling direction estimation unit 33d estimates the traveling direction of the magnetic body 200 with respect to the magnetic sensors 1, based on the classification by the classification unit 33c (waveform pattern classification unit) with respect to the waveform patterns of the magnetic signals 11 acquired by the magnetic sensors 1. With this configuration, it is possible to estimate the traveling direction of the magnetic body 200 with respect to the magnetic sensors 1 from the magnetic signals 11 acquired by the magnetic sensors 1. Consequently, the user can determine whether or not the magnetic body 200 is approaching the magnetic sensors 1, based on the estimation result 84 of the traveling direction of the magnetic body 200 estimated by the traveling direction estimation unit 33d.

Further, in the magnetic detection system 100 according to this embodiment, the generation unit 50 generates the fully connected layers 51c (sensor signal fully connected layers) based on the magnetic signals 11 acquired by the magnetic sensors 1 in which the features in the waveform patterns of the magnetic signals 11 are weighted and connected. Then, the classification unit 33c (waveform pattern classification unit) classifies the waveform patterns of the magnetic signals 11 acquired by the magnetic sensors 1, based on the waveform pattern distribution 60 and the features in the waveform patterns of the magnetic signals 11 of the fully connected layers 51c generated in the generation unit 50. According to this structure, the features in the waveform patterns of the magnetic signals 11 are weighted in the fully connected layers 51c. Therefore, the waveform patterns of the magnetic signals 11 can be more easily classified when classifying the waveform patterns of the magnetic signals 11 using the waveform pattern distribution 60.

Further, in the magnetic detection system 100 according to this embodiment, the classification unit 33c (waveform pattern classification unit) classifies the waveform patterns of the magnetic signals 11 acquired by the magnetic sensors 1, based on the dimensional compression result 82 that is the result of dimensionally compressing the outputs from the fully connected layers 52c (sensor signal fully connected layers) generated by the generation unit 50 and the waveform pattern distribution 60 generated by dimensionally compressing the output from each of the plurality of fully connected layers 51c. With this configuration, since the waveform pattern distribution 60 is generated by dimensionally compressing the output from each of the plurality of fully connected layers 52c, it is possible to reduce the dimension of the waveform pattern distribution 60. Consequently, as compared with the case in which the output from each of the plurality of fully connected layers 52c is not dimensionally compressed, the distribution of the waveform patterns in the waveform pattern distribution 60 can be easily confirmed by the generator of the waveform pattern distribution 60 and the user. Further, the outputs from the fully connected layers 51c are dimensionally compressed. Therefore, as compared with the case in which the outputs from the fully connected layers 51c are not dimensionally compressed, it is possible for the generator of the waveform pattern distribution and the user to easily compare the outputs from the fully connected layers 51c generated by the generation unit 50 and the waveform pattern distribution 60 generated by the dimensional compression.

Further, in the magnetic detection system 100 of this embodiment, the classification unit 33c (waveform pattern classification unit) is configured to classify the waveform patterns of the magnetic signals 11 acquired by the magnetic sensors 1 and inputted to the generation unit 50, based on the two-dimensionally compressed dimensional compression result 82 and the distribution ranges 60a, 60b, and 60c set in the two-dimensional waveform pattern distribution 60 generated by two-dimensionally compressing the output from each of the plurality of fully connected layers 51c. With this configuration, the waveform pattern distribution 60 is generated in two dimensions. Therefore, the generator of the waveform pattern distribution 60 and the user can set the distribution ranges 60a, 60b, and 60c by easily visually recognizing the distribution of the waveform patterns in the waveform pattern distribution 60. Further, since the outputs from the fully connected layers 51c are dimensionally compressed in two dimensions, it becomes possible to compare the outputs from the fully connected layers 51c and the distribution ranges 60a, 60b, and 60c set in the waveform pattern distribution 60 in the same dimension (two dimensions). Therefore, it is possible for the user to compare the outputs from the fully connected layers 51c and the distribution ranges 60a, 60b, and 60c set in the waveform pattern distribution 60 by easily visually recognizing them.

Further, in the magnetic detection system 100 according to this embodiment, the generation unit 50 generates the fully connected layer 51c (sensor signal fully connected layer), based on the input layers 51a, which are input data of the magnetic signals 11 inputted to the trained model 51 of the generation unit 50 and acquired by the magnetic sensors 1. Then, the generation unit 50 generates the output layers 51d for outputting the determination result 81 on whether or not the magnetic signal 11 acquired by the magnetic sensor 1 is derived from the magnetic body 200, based on the generated fully connected layers 51c. With this configuration, the determination result 81 on whether or not the magnetic signal 11 acquired by the magnetic sensors 1 is derived from the magnetic body 200 is outputted by the trained model 51 of the generation unit 50. Therefore, for the acquired magnetic signal 11, the user can easily confirm whether or not the magnetic signal 11 is derived from the magnetic body 200.

(Effects of Waveform Pattern Classification Method of Magnetic Signal by this Embodiment)

In the waveform pattern classification method of the magnetic signal 11 according to this embodiment, the following effects can be obtained.

In the waveform pattern classification method of the magnetic signal 11 according to this embodiment, the waveform patterns of the magnetic signals 11 acquired by the magnetic sensors 1 are classified, based on the fully connected layers 51c (sensor signal fully connected layers) in which the features in the waveform patterns of the magnetic signals 11 acquired by the magnetic sensors 1 and the waveform pattern distribution 60. As a result, it is possible to classify the waveform patterns of the magnetic signals 11 acquired by the magnetic sensors 1 from the fully connected layers 51c in which the features in the waveform patterns of the magnetic signals 11 acquired by the magnetic sensors 1 are weighted and connected, using the waveform pattern distribution 60 generated based on the plurality of fully connected layers 52c generated by weighting the respective features for each waveform pattern of the plurality of signals. There is a correlation between the waveform pattern of the magnetic signal 11 and the relative position and the traveling direction of the magnetic body 200 with respect to the magnetic sensor 1. Therefore, based on the classification result 83 of the waveform patterns of the magnetic signals 11, it is possible to determine the relative position and the traveling direction of the magnetic body 200 with respect to the magnetic sensors 1. Consequently, it is possible to provide a waveform pattern classification method for the magnetic signal 11 capable of discriminating the traveling direction of the magnetic body 200 from the magnetic signals 11 acquired by the magnetic sensors 1.

Further, in the waveform pattern classification method for the magnetic signal 11 according to the above-described embodiment, the following further effects can be obtained by the following configuration.

Further, in the waveform pattern classification method for the magnetic signal 11 according to this embodiment, the traveling direction of the magnetic body 200 with respect to the magnetic sensors 1 is estimated based on the classification of the waveform patterns of the magnetic signals 11 acquired by the magnetic sensors 1. By configuring as described above, it is possible to estimate the traveling direction of the magnetic body 200 with respect to the magnetic sensors 1 from the magnetic signals 11 acquired by the magnetic sensors 1. Consequently, the user can determine whether or not the magnetic body 200 is approaching the magnetic sensors 1, based on the estimation result 84 of the traveling direction of the magnetic body 200.

(Effects of Waveform Pattern Distribution Generation Method for Magnetic Detection System by this Embodiment)

In the waveform pattern distribution generation method for the magnetic detection system according to his embodiment, the following effects can be obtained.

In the waveform pattern distribution generation method for the magnetic detection system according to this embodiment, the waveform pattern distribution 60, which is the waveform pattern distribution of the plurality of signals, is generated based on the plurality of fully connected layers 52c in which the respective characteristics in the waveform patterns of the plurality of signals are weighted and connected for each waveform pattern of the plurality of signals each corresponding to the relative position and the traveling direction of the magnetic body 200 with respect to the magnetic sensor 1. By configuring as described above, it is possible to classify the waveform patterns of the magnetic signals 11 acquired by the magnetic sensors 1 from the features in the waveform patterns of the magnetic signals 11 acquired by the magnetic sensors 1, by using the generated waveform pattern distribution 60 in the magnetic detection system 100. There is a correlation between the waveform pattern of the magnetic signal 11 and the relative position and the traveling direction of the magnetic body 200 with respect to the magnetic sensor 1. Therefore, based on the classification result 83 of the waveform pattern of the magnetic signal 11, it is possible to determine the relative position and the traveling direction of the magnetic body 200 with respect to the magnetic sensors 1. Consequently, it is possible to provide a waveform pattern distribution generation method for the magnetic detection system capable of determining the traveling direction of the magnetic body 200 from the magnetic signals 11 acquired by the magnetic sensors 1.

Further, in the waveform pattern distribution generation method for the magnetic detection system according to the above-described embodiment, by configuring as follows, further effects described below can be obtained.

Further, in the waveform pattern distribution generation method for the magnetic detection system according to this embodiment, the waveform pattern distribution 60 is generated based on the result of dimensionally compressing the plurality of fully connected layers 52c. With this, the generator of the waveform pattern distribution 60 and the user can easily confirm the distribution of the waveform patterns in the waveform pattern distribution 60, as compared with the case in which the plurality of fully connected layers 52c is not dimensionally compressed.

[Modified Embodiments]

It should be understood that the embodiments disclosed here are examples in all respects and are not restrictive. The scope of the present invention is indicated by the appended claims rather than by the description of the above-described embodiments and includes all modifications (changes) within the meanings and the scopes equivalent to the claims.

For example, in the above-described embodiment, an example is shown in which the magnetic detection system 100 is configured to acquire the magnetic signals 11 by the plurality of magnetic sensors 1, but the present invention is not limited thereto. The present invention may be applied to a magnetic detection system configured to acquire a magnetic signal 11 by only one magnetic sensor.

Figure 22:
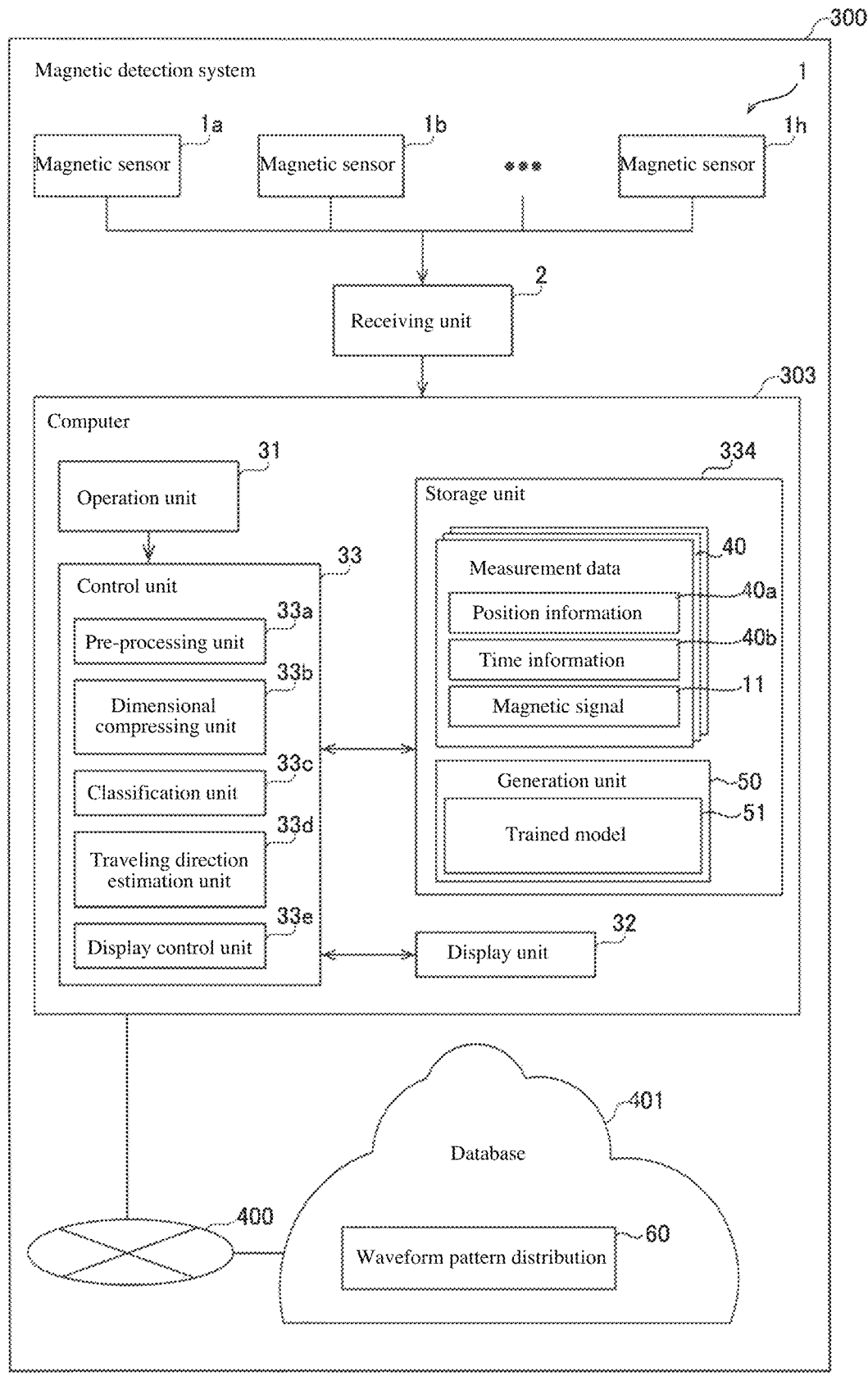
FIG. 22 is a block diagram showing a first modification of a magnetic detection system according to one embodiment of the present invention.

Further, in the above-described embodiment, an example is shown in which the waveform pattern distribution 60 is stored in the storage unit 34, but the present invention is not limited thereto. In the present invention, as shown in a magnetic detection system 300 according to a first modification shown in FIG. 22, the computer 303 may be connected to the network 400 such that the waveform pattern distribution 60 is stored in the external database 401 without being stored in the storage unit 334.

Figure 23:
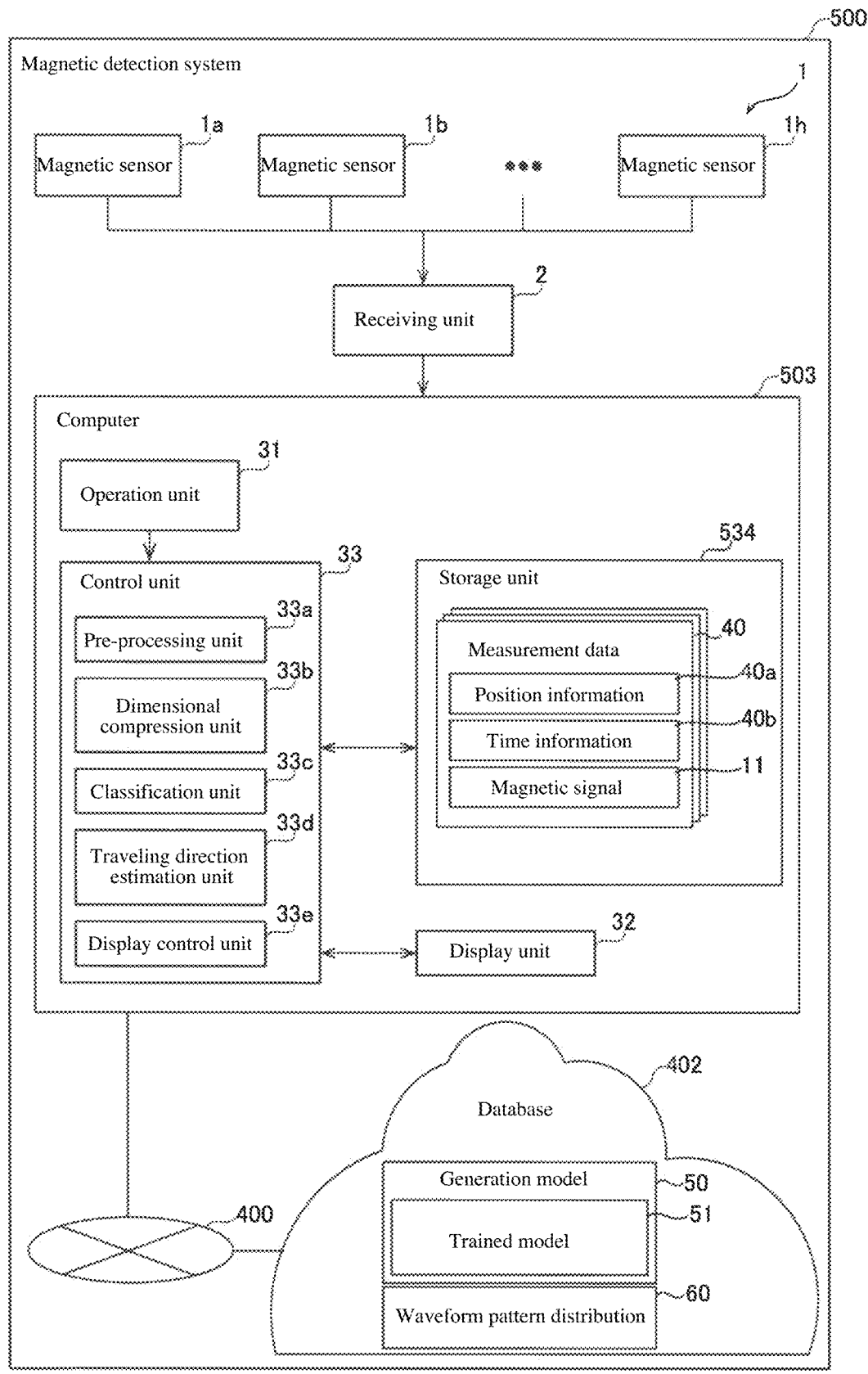
FIG. 23 is a block diagram showing a second modification of a magnetic detection system according to one embodiment of the present invention.

Further, in the above-described embodiment, an example is shown in which the generation unit 50 including the waveform pattern distribution 60 and the trained model 51 is stored in the storage unit 34, but the present invention is not limited thereto. In the present invention, like a magnetic detection system 500 according to a second modification shown in FIG. 23, the computer 503 may be connected to the network 400 such that the generation unit 50 including the waveform pattern distribution 60 and the trained model 51 is stored in the external database 402 without being stored in the storage unit 534.

Figure 24:
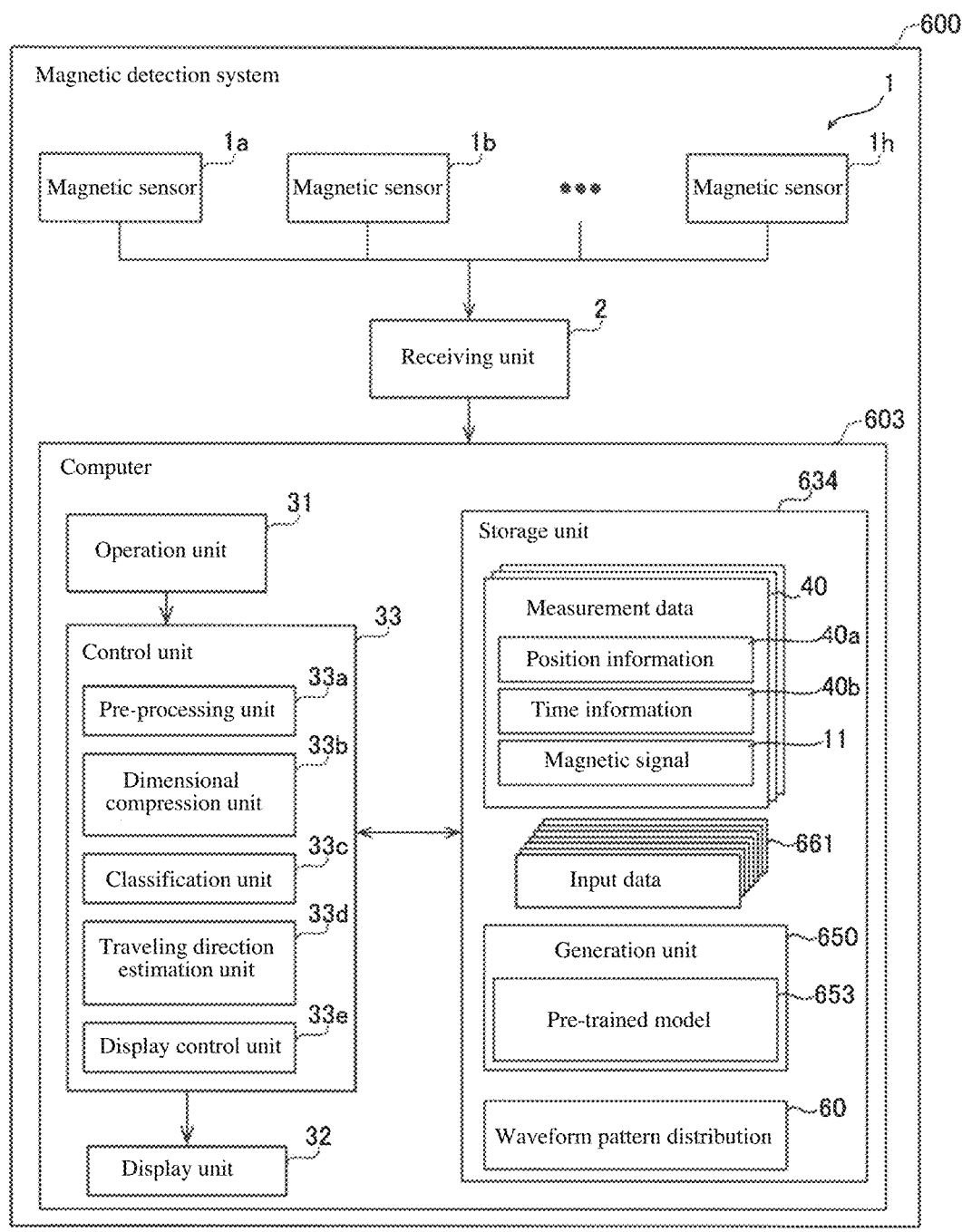
FIG. 24 is a block diagram showing a third modification of a magnetic detection system according to one embodiment of the present invention.

Further, in the above-described embodiment, an example is shown in which the trained model 51 generated in advance by machine-learning is stored in the storage unit 34, but the present invention is not limited to this. In the present invention, like a magnetic detection system 600 according to a third modification shown in FIG. 24, it may be configured such that the input data 661 used for machine-learning is stored in the storage unit 634 of the computer 603 and the trained model is generated in the computer 603 by inputting the input data 661 to the pre-trained model 653 of the generation unit 650.

Further, in the above-described embodiment, an example is shown in which the determination result 81 on whether or not the magnetic signal 11 is derived from the magnetic body 200 is based on the output of the output layers 51d, but the present invention is not limited thereto. In the present invention, it may be configured to perform the determination on whether or not the magnetic signal is derived from the magnetic body depending on whether or not the classification result of the waveform patterns falls within the distribution range of noise in the waveform pattern distribution.

Further, in the above-described embodiment, an example is shown in which the dimensional compression result 82 and the output from each of the plurality of fully connected layers 52c are two-dimensionally compressed, but the present invention is not limited thereto. In the present invention, it may be configured such that the dimensional compression result and the output from each of the fully connected layers are three-dimensionally compressed to generate a three-dimensional waveform pattern distribution.

Figure 25:
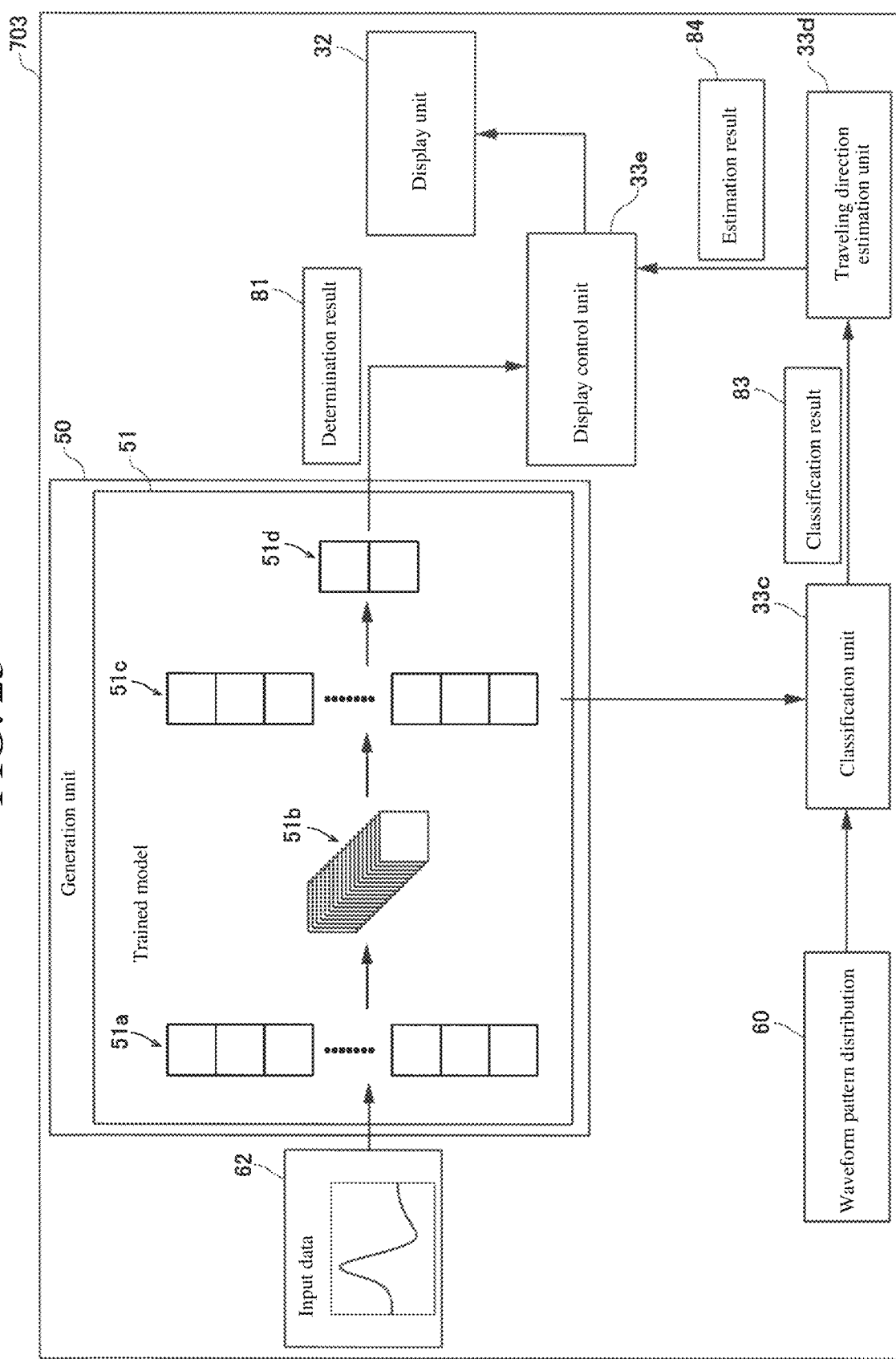
FIG. 25 is a block diagram showing a fourth modification of a magnetic detection system according to one embodiment of the present invention.

Further, in the above-described embodiment, an example is shown in which the waveform patterns are classified based on the dimensional compression result 82 acquired by dimensionally compressing the outputs of the fully connected layers 51c (sensor signal fully connected layers) and the waveform pattern distribution 60, but the present invention is not limited thereto. In the present invention, like a fourth modification shown in FIG. 25, it may be configured such that in the computer 703, without dimensionally compressing the outputs of the sensor signal fully connected layers (fully connected layers 51c), the waveform patterns are classified based on the features in the waveform patterns of the magnetic signals 11 weighted in the outputs from the convolution layers 51b included in the sensor signal fully connected layers (fully connected layers 51c) and the waveform pattern distribution 60.

Further, in the above-described embodiment, an example is shown in which the trained model 51 is generated by performing machine-learning by using one-dimensional convolutional neural network model using the plurality of simulation waveforms generated by simulating the magnetic signals 11 derived from the magnetic body 200 and the plurality of noise waveforms as the input data 61, but the present invention is not limited thereto. In the present invention, it may be configured such that the trained model is generated by performing machine-learning using the magnetic waveforms generated based on the magnetic signals actually acquired by the magnetic sensors of the magnetic detection system as the input data. Further, in the present invention, it may be configured such that the trained model is generated by performing machine-learning using the plurality of simulation waveforms generated by simulation, a plurality of noise waveforms, and the magnetic waveforms generated based on the magnetic signals actually acquired by the magnetic sensors of the magnetic detection system.

Further, in the above-described embodiment, an example is shown in which the traveling direction estimation unit 33*d* for estimating the traveling direction of the magnetic body 200 with respect to the magnetic sensors 1 based on the classification result 83 is provided, but the present invention is not limited thereto. In the present invention, the magnetic detection system may be configured to only classify the waveform patterns by the waveform pattern classification unit to estimate the traveling direction of the magnetic body by the user. Further, in the present invention, the magnetic detection system may notify the user of the traveling direction of the magnetic body when the magnetic body passes, based on the classification result 83.

Further, in the above-described embodiment, an example is shown in which the magnetic sensors 1 are installed in the detection region 10 to detect the magnetic signals 11 derived from the magnetic body 200, but the present invention is not limited thereto. In the present invention, it may be configured to detect the relative position of the magnetic body with respect to the magnetic sensors by moving the magnetic sensors.

Further, in the above-described embodiment, for convenience of explanation, an explanation has been made using a flow-driven flowchart in which the processing is sequentially performed along the traveling direction estimation processing by the magnetic detection system 100 of the present invention in accordance with the processing flow, but the present invention is not limited thereto. In the present invention, the processing operation may be performed by event-driven type processing that executes processing on an event-by-event basis. In this case, the processing operation may be performed in a complete event-driven fashion or in combination of event-driven type processing and flow-driven type processing.

Further, in the above-described embodiment, for convenience of explanation, the description has been made using the flow-driven flowchart in which the generation processing of the waveform pattern distribution 60 of the present invention is performed in order along the processing flow, but the present invention is not limited thereto. In the present invention, the processing operation may be performed by event-driven type processing that executes processing on an event-by-event basis. In this case, the processing operation may be performed in a complete event-driven fashion or in combination of event-driven type processing and flow-driven type processing.

[Aspects]

It will be understood by those skilled in the art that the above-described exemplary embodiments are concrete examples of the following aspects.

(Item 1)

A magnetic detection system comprising:
  a magnetic sensor arranged in water to acquire magnetic signals; and
  a waveform pattern classification unit,
  wherein the waveform pattern classification unit is configured to classify waveform patterns of a plurality of magnetic signals acquired by the magnetic sensor, based on a waveform pattern distribution and features in the waveform patterns of the plurality of magnetic signals acquired by the magnetic sensor, the waveform pattern distribution being generated based on a plurality of fully connected layers generated by weighting and connecting respective features in the waveform patterns of the plurality of magnetic signals for each waveform pattern by machine-learning the waveform patterns of the plurality of magnetic signals as input data, the waveform patterns of the plurality of magnetic signals each corresponding to a relative position and a traveling direction of a magnetic body with respect to the magnetic sensor.

(Item 2)

The magnetic detection system as recited in the above-described Item 1, further comprising:
  a traveling direction estimation unit,
  wherein the traveling direction estimation unit is configured to estimate the traveling direction of the magnetic body with respect to the magnetic sensor, based on a classification by the waveform pattern classification unit with respect to the waveform patterns of the magnetic signals acquired by the magnetic sensor.

(Item 3)

The magnetic detection system as recited in the above-described Item 1 or 2, further comprising:
  a generation unit,
  wherein the generation unit is configured to generate sensor signal fully connected layers by inputting the magnetic signals acquired by the magnetic sensor to a trained model in which the waveform patterns of the plurality of magnetic signals each corresponding to the relative position and the traveling direction of the magnetic body with respect to the magnetic sensor are machine-learned as the input data, the sensor signal fully connected layers being fully connected layers based on the magnetic signals acquired by the magnetic sensor and being a layer in which features in the waveform patterns of the plurality of input magnetic signals are weighted and connected, and
  wherein the waveform pattern classification unit is configured to classify the waveform patterns of the magnetic signals acquired by the magnetic sensor, based on the waveform pattern distribution and the features in the waveform patterns of the magnetic signals of the sensor signal fully connected layers generated by the generation unit.

(Item 4)

The magnetic detection system as recited in the above-described Item 3,
  wherein the waveform pattern classification unit is configured to classify the waveform patterns of the magnetic signals acquired by the magnetic sensor, based on a dimensional compression result that is a result of dimensional compression of outputs from the sensor signal fully connected layers generated by the generation unit and the waveform pattern distribution generated by dimensionally compressing an output from each of the plurality of fully connected layers.

(Item 5)

The magnetic detection system as recited in the above-described Item 4,
wherein the waveform pattern classification unit is configured to classify the waveform patterns of the magnetic signals captured by the image sensor and inputted to the generation unit, based on the dimensional compression result dimensionally compressed in two dimensions and a distribution range set in a two-dimensional waveform pattern distribution generated by dimensionally compressing the output from each of the plurality of fully connected layers in two dimensions.

(Item 6)

The magnetic detection system as recited in any one of the above-described Items 3 to 5,
wherein the trained model is a trained neural network model, and
wherein the generation unit is configured to
generate the sensor signal fully connected layers based on input layers that are input data of the magnetic signals acquired by the magnetic sensor and inputted to the trained model of the generation unit, and
generate an output layer for outputting a determination result on whether or not the magnetic signals acquired by the magnetic sensor are derived from a magnetic body based on the generated sensor signal fully connected layers.

(Item 7)

A magnetic signal waveform pattern classification method, comprising the steps of:
acquiring magnetic signals by a magnetic sensor arranged in water;
inputting the magnetic signals acquired by the magnetic sensor to a trained model in which waveform patterns of a plurality of magnetic signals each corresponding to a relative position and a traveling direction of a magnetic body with respect to the magnetic sensor are machine-learned as input data;
generating sensor signal fully connected layers in which features in the waveform patterns of the magnetic signals acquired by the magnetic sensor and inputted to the trained model are weighted and connected; and
classifying the waveform patterns of the magnetic signals acquired by the magnetic sensor, based on a waveform pattern distribution and the sensor signal fully connected layers generated using the trained model, the waveform pattern distribution being a distribution of waveform patterns of the plurality of magnetic signals generated based on a plurality of fully connected layers generated by weighting and connecting respective features in the waveform patterns of a plurality of magnetic signals each corresponding to a relative position and a traveling direction of a magnetic body with respect to the magnetic sensor as input data by machine-learning.

(Item 8)

The magnetic signal waveform pattern classification method as recited in the above-described Item 7, further comprising the step of:
estimating the traveling direction of the magnetic body with respect to the magnetic sensor, based on a classification of the waveform patterns of the magnetic signals acquired by the magnetic sensor.

(Item 9)

A waveform pattern distribution generation method for a magnetic detection system, comprising the steps of:

machine-learning waveform patterns of a plurality of magnetic signals each corresponding to a relative position and a traveling direction of a magnetic body with respect to a magnetic sensor as input data;
generating a plurality of fully connected layers in which respective features in the waveform patterns of the plurality of magnetic signals are weighted and connected for each waveform pattern, using a trained model in which the waveform patterns of the plurality of magnetic signals each corresponding to the relative position and the traveling direction of the magnetic body with respect to the magnetic sensor are machine-learned as input data; and
generating a waveform pattern distribution that is a distribution of the waveform patterns of the plurality of magnetic signals used to classify the waveform patterns of the magnetic signals acquired by the magnetic sensor, based on the plurality of fully connected layers.

(Item 10)

The waveform pattern distribution generation method for a magnetic detection system as recited in the above-described Item 9,
wherein the step of generating the waveform pattern distribution is a step of generating the waveform pattern distribution based on a result of a dimensional compression of the plurality of fully connected layers.

DESCRIPTION OF SYMBOLS

1: Magnetic sensor
11: Magnetic Signal
33c: Classification unit (waveform pattern classification unit)
33d: Traveling direction estimation unit
50: Generation unit
51: Trained model
  51a: Input layer
  51c: Fully connected layer
  51d: Output layer
  52c: Fully connected layer(s)
60: Waveform pattern distribution
  60a: Distribution range (configured distribution range)
  60b: Distribution range (configured distribution range)
  60c: Distribution range (configured distribution range)
61: Input data
81: Determination result
82: Dimensional compression result
100: Magnetic detection system
200: Magnetic body

The invention claimed is:

1. A magnetic detection system comprising:
a magnetic sensor arranged in water to acquire magnetic signals; and
a waveform pattern classification unit,
wherein the waveform pattern classification unit is configured to classify waveform patterns of a plurality of magnetic signals acquired by the magnetic sensor, based on a waveform pattern distribution and features in the waveform patterns of the plurality of magnetic signals acquired by the magnetic sensor, the waveform pattern distribution being generated based on a plurality of fully connected layers generated by weighting and connecting respective features in the waveform patterns of the plurality of magnetic signals for each waveform pattern by machine-learning the waveform patterns of the plurality of magnetic signals as input data, the waveform patterns of the plurality of magnetic signals each corresponding to a relative position and a traveling direction of a magnetic body with respect to the magnetic sensor.

2. The magnetic detection system as recited in claim 1, further comprising:
a traveling direction estimation unit,
wherein the traveling direction estimation unit is configured to estimate the traveling direction of the magnetic body with respect to the magnetic sensor, based on a classification by the waveform pattern classification unit with respect to the waveform patterns of the magnetic signals acquired by the magnetic sensor.

3. The magnetic detection system as recited in claim 1, further comprising:
a generation unit,
wherein the generation unit is configured to generate sensor signal fully connected layers by inputting the magnetic signals acquired by the magnetic sensor to a trained model in which the waveform patterns of the plurality of magnetic signals each corresponding to the relative position and the traveling direction of the magnetic body with respect to the magnetic sensor are machine-learned as the input data, the sensor signal fully connected layers being fully connected layers based on the magnetic signals acquired by the magnetic sensor and being a layer in which features in the waveform patterns of the plurality of input magnetic signals are weighted and connected, and
wherein the waveform pattern classification unit is configured to classify the waveform patterns of the magnetic signals acquired by the magnetic sensor, based on the waveform pattern distribution and the features in the waveform patterns of the magnetic signals of the sensor signal fully connected layers generated by the generation unit.

4. The magnetic detection system as recited in claim 3,
wherein the waveform pattern classification unit is configured to classify the waveform patterns of the magnetic signals acquired by the magnetic sensor, based on a dimensional compression result that is a result of dimensional compression of outputs from the sensor signal fully connected layers generated by the generation unit and the waveform pattern distribution generated by dimensionally compressing an output from each of the plurality of fully connected layers.

5. The magnetic detection system as recited in claim 4,
wherein the waveform pattern classification unit is configured to classify the waveform patterns of the magnetic signals captured by the image sensor and inputted to the generation unit, based on the dimensional compression result dimensionally compressed in two dimensions and a distribution range set in a two-dimensional waveform pattern distribution generated by dimensionally compressing the output from each of the plurality of fully connected layers in two dimensions.

6. The magnetic detection system as recited in claim 3,
wherein the trained model is a trained neural network model, and
wherein the generation unit is configured to
generate the sensor signal fully connected layers based on input layers that are input data of the magnetic signals acquired by the magnetic sensor and inputted to the trained model of the generation unit, and generate an output layer for outputting a determination result on whether or not the magnetic signals acquired by the magnetic sensor are derived from a magnetic body based on the generated sensor signal fully connected layers.

7. A magnetic signal waveform pattern classification method, comprising the steps of:
acquiring magnetic signals by a magnetic sensor arranged in water;
inputting the magnetic signals acquired by the magnetic sensor to a trained model in which waveform patterns of a plurality of magnetic signals each corresponding to a relative position and a traveling direction of a magnetic body with respect to the magnetic sensor are machine-learned as input data;
generating sensor signal fully connected layers in which features in the waveform patterns of the magnetic signals acquired by the magnetic sensor and inputted to the trained model are weighted and connected; and
classifying the waveform patterns of the magnetic signals acquired by the magnetic sensor, based on a waveform pattern distribution and the sensor signal fully connected layers generated using the trained model, the waveform pattern distribution being a distribution of waveform patterns of the plurality of magnetic signals generated based on a plurality of fully connected layers generated by weighting and connecting respective features in the waveform patterns of a plurality of magnetic signals each corresponding to a relative position and a traveling direction of a magnetic body with respect to the magnetic sensor as input data by machine-learning.

8. The magnetic signal waveform pattern classification method as recited in claim 7, further comprising the step of:
estimating the traveling direction of the magnetic body with respect to the magnetic sensor, based on a classification of the waveform patterns of the magnetic signals acquired by the magnetic sensor.

9. A waveform pattern distribution generation method for a magnetic detection system, comprising the steps of:
machine-learning waveform patterns of a plurality of magnetic signals each corresponding to a relative position and a traveling direction of a magnetic body with respect to a magnetic sensor as input data;
generating a plurality of fully connected layers in which respective features in the waveform patterns of the plurality of magnetic signals are weighted and connected for each waveform pattern, using a trained model in which the waveform patterns of the plurality of magnetic signals each corresponding to the relative position and the traveling direction of the magnetic body with respect to the magnetic sensor are machine-learned as input data; and
generating a waveform pattern distribution that is a distribution of the waveform patterns of the plurality of magnetic signals used to classify the waveform patterns of the magnetic signals acquired by the magnetic sensor, based on the plurality of fully connected layers.

10. The waveform pattern distribution generation method for a magnetic detection system, as recited in claim 9,
wherein the step of generating the waveform pattern distribution is a step of generating the waveform pattern distribution based on a result of a dimensional compression of the plurality of fully connected layers.

* * * * *